US008633590B2

(12) United States Patent
Yamazaki

(10) Patent No.: US 8,633,590 B2
(45) Date of Patent: Jan. 21, 2014

(54) SEMICONDUCTOR DEVICE AND METHOD FOR MANUFACTURING THE SAME

(75) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/348,097

(22) Filed: Jan. 11, 2012

(65) Prior Publication Data

US 2012/0104568 A1    May 3, 2012

Related U.S. Application Data

(62) Division of application No. 12/211,936, filed on Sep. 17, 2008, now Pat. No. 8,110,479.

(30) Foreign Application Priority Data

Sep. 21, 2007   (JP) .................................. 2007-245822

(51) Int. Cl.
*H01L 23/48*         (2006.01)
(52) U.S. Cl.
USPC ........... 257/758; 257/649; 257/760; 257/782; 257/E23.002
(58) Field of Classification Search
USPC .......... 257/775, 758, E21.275, 649, 701, 760, 257/782, E21.267, E21.276, E23.002
See application file for complete search history.

(56) References Cited

U.S. PATENT DOCUMENTS 5,374,564 A    12/1994   Bruel
6,140,210 A    10/2000   Aga et al.
(Continued)

FOREIGN PATENT DOCUMENTS

CN    1682152         10/2005
EP    1717847 A       11/2006
(Continued)

OTHER PUBLICATIONS

Sullivan et al., "P-220L: Late-News Poster: Layer-Transfer of Silicon Single-Crystal Films on Large-Area Glass Substrates for Mobile Display Applications," SID 06 Digest, Jun. 2006, pp. 280-282.

(Continued)

*Primary Examiner* — Kenneth Parker
*Assistant Examiner* — Jose R Diaz
(74) *Attorney, Agent, or Firm* — Eric J. Robinson; Robinson Intellectual Property Law Office, P.C.

(57) ABSTRACT

To provide a method for manufacturing a large-area semiconductor device, to provide a method for manufacturing a semiconductor device with high efficiency, and to provide a highly-reliable semiconductor device in the case of using a large-area substrate including an impurity element. A plurality of single crystal semiconductor substrates are concurrently processed to manufacture an SOI substrate, so that an area of a semiconductor device can be increased and a semiconductor device can be manufactured with improved efficiency. In specific, a series of processes is performed using a tray with which a plurality of semiconductor substrates can be concurrently processed. Here, the tray is provided with at least one depression for holding single crystal semiconductor substrates. Further, deterioration of characteristics of a manufactured semiconductor element is prevented by providing an insulating layer serving as a barrier layer against an impurity element which may affect characteristics of the semiconductor element.

17 Claims, 21 Drawing Sheets

(56) References Cited

U.S. PATENT DOCUMENTS

| | | |
|---|---|---|
| 6,287,941 B1 | 9/2001 | Kang et al. |
| 6,583,440 B2 | 6/2003 | Yasukawa |
| 6,633,061 B2 | 10/2003 | Lutzen et al. |
| 6,653,209 B1 | 11/2003 | Yamagata |
| 6,759,277 B1 | 7/2004 | Flores et al. |
| 6,818,529 B2 | 11/2004 | Bachrach et al. |
| 6,818,921 B2 | 11/2004 | Yasukawa |
| 6,849,872 B1 | 2/2005 | Yamazaki et al. |
| 6,867,067 B2 | 3/2005 | Ghyselen et al. |
| 6,884,694 B2 | 4/2005 | Park et al. |
| 6,964,914 B2 | 11/2005 | Ghyselen et al. |
| 7,071,029 B2 | 7/2006 | Ghyselen et al. |
| 7,112,514 B2 | 9/2006 | Yasukawa |
| 7,119,365 B2 | 10/2006 | Takafuji et al. |
| RE39,484 E | 2/2007 | Bruel |
| 7,288,458 B2 | 10/2007 | Adetutu et al. |
| 7,354,844 B2 | 4/2008 | Endo et al. |
| 7,407,869 B2 | 8/2008 | Ghyselen et al. |
| 7,422,957 B2 | 9/2008 | Ghyselen et al. |
| 7,465,677 B2 | 12/2008 | Isobe et al. |
| 7,465,991 B2 | 12/2008 | Ghyselen et al. |
| 7,622,330 B2 | 11/2009 | Ghyselen et al. |
| 7,638,408 B2 | 12/2009 | Yamazaki et al. |
| 7,655,537 B2 | 2/2010 | Ghyselen et al. |
| 7,674,687 B2 | 3/2010 | Henley |
| 7,682,931 B2 | 3/2010 | Yamazaki et al. |
| 7,718,547 B2 | 5/2010 | Isobe et al. |
| 7,736,993 B2 | 6/2010 | Allibert et al. |
| 7,741,678 B2 | 6/2010 | Ghyselen et al. |
| 7,846,817 B2 | 12/2010 | Yamazaki et al. |
| 7,851,332 B2 | 12/2010 | Yamazaki et al. |
| 7,855,106 B2 | 12/2010 | Yamazaki et al. |
| 7,911,016 B2 | 3/2011 | Henley |
| 7,977,747 B2 | 7/2011 | Allibert et al. |
| 8,012,855 B2 | 9/2011 | Henley |
| 8,071,463 B2 | 12/2011 | Henley |
| 8,153,513 B2 | 4/2012 | Henley |
| 2002/0070454 A1 | 6/2002 | Yasukawa |
| 2004/0238851 A1 | 12/2004 | Flores et al. |
| 2005/0032283 A1 | 2/2005 | Itoga et al. |
| 2006/0115948 A1* | 6/2006 | Tokunaga ............... 438/299 |
| 2007/0063281 A1 | 3/2007 | Takafuji et al. |
| 2007/0120681 A1* | 5/2007 | Yamazaki et al. ......... 340/572.8 |
| 2008/0063840 A1 | 3/2008 | Morita et al. |
| 2009/0047771 A1 | 2/2009 | Yamazaki et al. |
| 2009/0079025 A1 | 3/2009 | Yamazaki |
| 2009/0081844 A1 | 3/2009 | Yamazaki |
| 2011/0086472 A1 | 4/2011 | Yamazaki et al. |

FOREIGN PATENT DOCUMENTS

| | | |
|---|---|---|
| JP | 05-055581 A | 3/1993 |
| JP | 05-211128 | 8/1993 |
| JP | 2000-331899 A | 11/2000 |
| JP | 2003-172950 A | 6/2003 |
| JP | 2003-257804 | 9/2003 |
| JP | 2004-179356 A | 6/2004 |
| JP | 2006-332634 A | 12/2006 |
| TW | 518753 | 1/2003 |
| TW | 554452 | 9/2003 |
| TW | 200729356 | 8/2007 |
| WO | WO-03/062507 | 7/2003 |
| WO | WO 2004/025360 | 3/2004 |
| WO | WO-2007/014320 | 2/2007 |
| WO | WO-2008/014339 | 1/2008 |

OTHER PUBLICATIONS

Chinese Office Action (Application No. 200810213176.X) dated Jul. 26, 2011.

Taiwanese Office Action (Application No. 97134695) Dated Sep. 25, 2013.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device having an SOI (silicon on insulator) structure and a method for manufacturing the semiconductor device. In this specification, the semiconductor device refers to any device which can function with the use of semiconductor characteristics.

2. Description of the Related Art

In recent years, VLSI technology has been dramatically progressed, and an SOI structure by which speeding up and low power consumption are realized has been attracted attention. In this technology, an active region (channel formation region) of a field-effect transistor (FET), which has been conventionally formed using bulk single crystal silicon, is formed using a single crystal silicon thin film. It is known that a MOS field-effect transistor manufactured using an SOI structure has lower parasitic capacitance than that manufactured using a conventional bulk single crystal silicon substrate, and such a MOS field-effect transistor is advantageous for speeding up.

Examples of substrates having SOI structures (hereinafter, also referred to as SOI substrates) include SIMOX substrates, bonded substrates, and the like. For example, for an SOI structure of a SIMOX substrate, oxygen ions are implanted into a single crystal silicon substrate, and heat treatment at 1300° C. or higher is conducted to form a buried oxide film (BOX) layer, so that a single crystal silicon thin film is formed on the surface. In the SIMOX substrate, oxygen ion implantation can be controlled precisely and thus a single crystal silicon thin film having an even thickness can be formed with high control; however, there is a problem in that long time period is needed for oxygen ion implantation, thereby causing problems of time and costs. Further, there is another problem in that the single crystal silicon thin film is easily damaged in the oxygen ion implantation.

For a bonded substrate (an SOI substrate), two single crystal silicon substrates (a base substrate and a bond substrate) are bonded to each other with an oxide film interposed therebetween, and one of the single crystal silicon substrates (the bond substrate) is thinned by grinding and/or polishing on its rear side (the side which is not a surface to be bonded), so that a single crystal silicon thin film is formed. Since it is difficult to form a uniform and thin single crystal silicon thin film by grinding and/or polishing, there is proposed a technique for thinning a film which employs hydrogen ion implantation, which is so-called Smart-Cut (registered trademark) (e.g., Reference 1: Japanese Published Patent Application No. H5-211128).

SUMMARY OF THE INVENTION

However, in a conventional SOI substrate, a single crystal silicon wafer is used as a base substrate. Therefore, it has been difficult to increase an area of the SOI substrate. In view of the foregoing problem, it is an object of the present invention to provide a method for manufacturing a large-area semiconductor device. It is another object of the present invention to provide a method for manufacturing a semiconductor device with high efficiency. It is still another object the present invention to provide a highly reliable semiconductor device in the case of using a large-area substrate including an impurity element. It is yet another object of the present invention to provide a semiconductor device, for which the above-described manufacturing method is used.

In the present invention, a plurality of single crystal semiconductor substrates are concurrently processed to manufacture an SOI substrate, so that an area of a semiconductor device can be increased and a semiconductor device can be manufactured with improved efficiency. In specific, a series of processes is performed using a tray with which a plurality of semiconductor substrates can be concurrently processed. Here, the tray is provided with at least one depression for holding single crystal semiconductor substrates. Further, deterioration of characteristics of a manufactured semiconductor element is prevented by providing an insulating layer serving as a barrier layer against an impurity element which may affect characteristics of the semiconductor element.

One aspect of a semiconductor device of the present invention includes a substrate including an impurity element which may affect characteristics of a semiconductor element; a bonding layer over the substrate; a first insulating layer serving as a barrier layer against the impurity element, over the bonding layer; and a plurality of semiconductor elements formed using one of a plurality of single crystal semiconductor layers over the first insulating layer, where a second insulating layer serving as a barrier layer is provided so as to cover the plurality of semiconductor elements.

Another aspect of a semiconductor device of the present invention includes a substrate including an impurity element which may affect characteristics of a semiconductor element; a first insulating layer serving as a barrier layer against the impurity element, over the substrate; a bonding layer over the first insulating layer; and a plurality of semiconductor elements formed using one of a plurality of single crystal semiconductor layers over the bonding layer, where a second insulating layer serving as a barrier layer is provided so as to cover the plurality of semiconductor elements.

In the above aspect, the first insulating layer is also present in a region corresponding to a gap between one of the plurality of single crystal semiconductor layers and another one of the plurality of single crystal semiconductor layers which is adjacent to the one of the plurality of single crystal semiconductor layers. Further, the gap is preferably less than or equal to 0.5 mm. Furthermore, a third insulating layer may be included between the bonding layer and the single crystal semiconductor layer.

Further, in the above aspect, for the first insulating layer, a stacked-layer structure of a silicon oxynitride film and a silicon nitride oxide film can be used. Furthermore, for the second insulating layer, a stacked-layer structure of a silicon oxynitride film and a silicon nitride oxide film can be used.

Various electronic devices can be provided using the above-described semiconductor devices.

One aspect of a method for manufacturing a semiconductor device of the present invention includes the steps of arranging a plurality of single crystal semiconductor substrates in a first tray; forming a first insulating layer serving as a barrier layer over each of the plurality of single crystal semiconductor substrates; forming a damaged region in each of the plurality of single crystal semiconductor substrates by irradiating each of the first insulating layers with ions; forming a bonding layer over the first insulating layer; bonding each of the single crystal semiconductor substrates to a substrate including an impurity element which may affect characteristics of a semiconductor element, by making the bonding layer over each of the plurality of single crystal semiconductor substrates arranged in a second tray in contact with the substrate; forming a plurality of single crystal semiconductor layers on the substrate by cleaving the plurality of single crystal semiconductor substrates along each of the damaged regions by performing heat treatment; forming a plurality of the semiconductor elements by using one of the plurality of single crystal semiconductor layers; and forming a second insulating layer serving as a barrier layer so as to cover the plurality of semiconductor elements.

Another aspect of a method for manufacturing a semiconductor device of the present invention includes the steps of arranging a plurality of single crystal semiconductor substrates in a first tray; forming a damaged region in each of the plurality of single crystal semiconductor substrates by irradiating the plurality of single crystal semiconductor substrates with ions; forming a bonding layer over each of the plurality of single crystal semiconductor substrates; forming a first insulating layer serving as a barrier layer over a substrate including an impurity element which may affect characteristics of a semiconductor element; bonding each of the single crystal semiconductor substrates to the substrate by making each of the bonding layers over the plurality of single crystal semiconductor substrates arranged in a second tray in contact with each of the first insulating layers on the substrate; forming a plurality of single crystal semiconductor layers on the substrate by cleaving the plurality of single crystal semiconductor substrates along each of the damaged regions by performing heat treatment; forming a plurality of the semiconductor elements by using one of the plurality of single crystal semiconductor layers; and forming a second insulating layer serving as a barrier layer so as to cover the plurality of semiconductor elements.

In the above aspect, the first insulating layer is also present in a region corresponding to a gap between one of the plurality of single crystal semiconductor layers and another one of the plurality of single crystal semiconductor layers which is adjacent to the one of the plurality of single crystal semiconductor layers. Further, the gap is preferably less than or equal to 0.5 mm. Furthermore, a third insulating layer may be formed between the bonding layer and each of the plurality of single crystal semiconductor substrate.

Further, in the above aspect, the first insulating layer can be formed to have a stacked-layer structure of a silicon oxynitride film and a silicon nitride oxide film. Furthermore, the second insulating layer can be formed to have a stacked-layer structure of a silicon oxynitride film and a silicon nitride oxide film.

Note that the first tray and the second tray are preferably formed using quartz glass or stainless steel. The first tray and the second tray may be the same or different. Here, in the case of including a process for cleaning a tray, a tray which has not undergone a cleaning process and a tray which has undergone a cleaning process can be regarded as different trays.

According to the present invention, a large-area semiconductor substrate (SOI substrate) can be provided. That is, an area of a semiconductor device can be increased. Thus, the productivity can be improved. Furthermore, even in the case where a substrate including a large amount of an impurity element is used as a base substrate, a reduction in reliability of a semiconductor device can be suppressed by providing an insulating layer serving as a barrier layer. That is, a highly reliable semiconductor device can be provided at low cost.

DETAILED DESCRIPTION OF THE INVENTION

Embodiment Mode

The present invention will be hereinafter described. The present invention can be implemented in various different modes, and it is easily understood by those skilled in the art that various changes and modifications of the modes and details are possible without departing from the purpose and scope of the present invention. Therefore, the present invention is not construed as being limited to the description of the Embodiment Modes and Embodiments. Further, the same portions are denoted by the same reference symbols through the drawings, and repetition explanation of materials, shapes, manufacturing methods, and the like is omitted.

(Embodiment Mode 1)

This embodiment mode describes a semiconductor substrate having a plurality of single crystal semiconductor layers over a substrate, and a method for manufacturing the semiconductor substrate.

Figure 1:
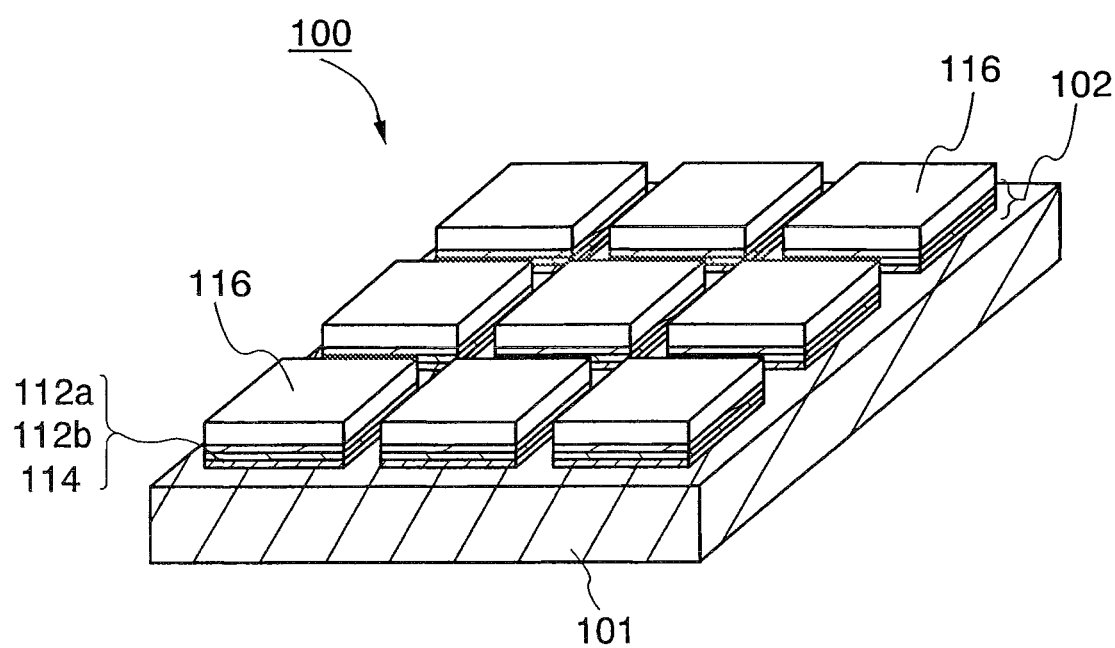
FIG. 1 is a diagram showing an example of an SOI substrate.

FIG. 1 is a perspective view showing a structural example of a semiconductor substrate 100. The semiconductor substrate 100 has a structure in which a plurality of single crystal semiconductor layers 116 are bonded to one base substrate, which is a base substrate 101. Each of the single crystal semiconductor layers 116 is provided for the base substrate 101 with an insulating layer 102 interposed therebetween. The semiconductor substrate 100 is a so-called SOI substrate.

The insulating layer 102 may have a single-layer structure or a stacked-layer structure. In this embodiment mode, the insulating layer 102 has a three-layer structure, in which a bonding layer 114, an insulating film 112b (a silicon nitride oxide layer), and an insulating film 112a (a silicon oxynitride layer) are stacked from the base substrate 101 side.

The single crystal semiconductor layer 116 is a layer formed by thinning a single crystal semiconductor substrate. As the single crystal semiconductor substrate, a commercially-available semiconductor substrate can be used. For example, a single crystal semiconductor substrate formed using an element belonging to Group 4 (an element of Group 14), such as a single crystal silicon substrate, a single crystal germanium substrate, or a single crystal silicon germanium substrate, can be used. Further, a compound semiconductor substrate using gallium arsenide, indium phosphide, or the like can be used.

As the base substrate 101, a substrate having an insulating surface may be used. As the substrates having an insulating surface, various kinds of glass substrates which are used in the electronics industry, quartz substrates, ceramics substrates, sapphire substrates, and the like are given. In terms of cost, glass substrates are preferably used for the base substrate 101. For the glass substrate, for example, substrates with coefficients of thermal expansion ranging from $25 \times 10^{-7}/°C$. to $50 \times 10^{-7}/°C$. (preferably $30 \times 10^{-7}/°C$. to $40 \times 10^{-7}/°C$.) inclusive and strain points ranging from 580° C. to 680° C. (preferably 600° C. to 680° C.) inclusive are preferably used. Furthermore, in order to reduce contamination of a semiconductor device, a non-alkali glass substrate is preferably used for the glass substrate. Non-alkali glass substrates are formed from glass materials such as aluminosilicate glass, aluminoborosilicate glass, and barium borosilicate glass. Further, for the base substrate 101, conductive substrates formed from a conductor such as metal or stainless steel, semiconductor substrates formed from a semiconductor such as silicon or gallium arsenide, or the like can be used instead of substrates having an insulating surface.

As a glass substrate, a mother glass which has been developed for manufacturing liquid crystal panels is preferably used. As a mother glass, for example, a substrate with a size such as a 3rd generation (550 mm×650 mm), a 3.5th generation (600 mm×720 mm), a 4th generation (680 mm×880 mm or 730 mm×920 mm), a 5th generation (1100 mm×1300 mm), a 6th generation substrate (1500 mm×1850 mm), a 7th generation (1870 mm×2200 mm), and an 8th generation (2200 mm×2400 mm) are known. By manufacturing an SOI substrate with large-area mother glass used as the base substrate 101, increasing the area of an SOI substrate can be realized.

By use of a large-area substrate such as mother glass for the base substrate 101, increasing the area of an SOI substrate can be realized. When increasing the area of an SOI substrate can be realized, a large-sized semiconductor device can be provided. Further, a lot of integrated circuits (also referred to as ICs, LSIs, or the like) can be manufactured at one time, and the number of semiconductor devices which are manufactured from a single substrate is increased. Thus, productivity can be drastically improved.

Hereinafter, a method for manufacturing the semiconductor substrate 100 shown in FIG. 1 is described with reference to FIG. 2, FIG. 3, FIG. 4, FIGS. 5A and 5B, FIGS. 6A and 6B, FIGS. 7A to 7D, FIGS. 8A and 8B, FIG. 9, and FIGS. 10A and 10B.

Figure 2:
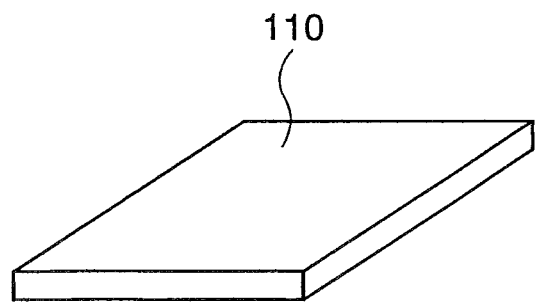
FIG. 2 is a diagram showing an example of a single crystal semiconductor substrate.

First, a single crystal semiconductor substrate 110 is prepared. The single crystal semiconductor substrate 110 is processed into a desired size and shape. FIG. 2 is an external view showing an example of a structure of the single crystal semiconductor substrate 110. In consideration of bonding to the base substrate 101 with a rectangular shape; a light exposure region of a light exposure apparatus such as a stepper which has a rectangular shape; and the like, the single crystal semiconductor substrate 110 preferably has a rectangular shape as shown in FIG. 2. For example, it is preferable, in terms of productivity, that processing be performed in such a way that a long side of the rectangular single crystal semiconductor substrate 110 is n times (n is a natural number) as large as a side of a light exposure region for one shot of a stepper. Note that the rectangle includes a square unless otherwise specified.

The rectangular single crystal semiconductor substrate 110 can be formed by cutting a bulk single crystal semiconductor substrate which is round and commercially available. For cutting of the substrate, cutting with a dicer or a wire saw, cutting using a laser beam, cutting using plasma, cutting using an electron beam, or an optional device for cutting can be used. Further, the rectangular single crystal semiconductor substrate can be manufactured in such a way that an ingot for manufacturing a semiconductor substrate, which has not been sliced into substrates, is processed into a rectangular parallelepiped shape so as to have a rectangular shape in its cross section and the ingot having the rectangular parallelepiped shape is sliced.

Figure 3:
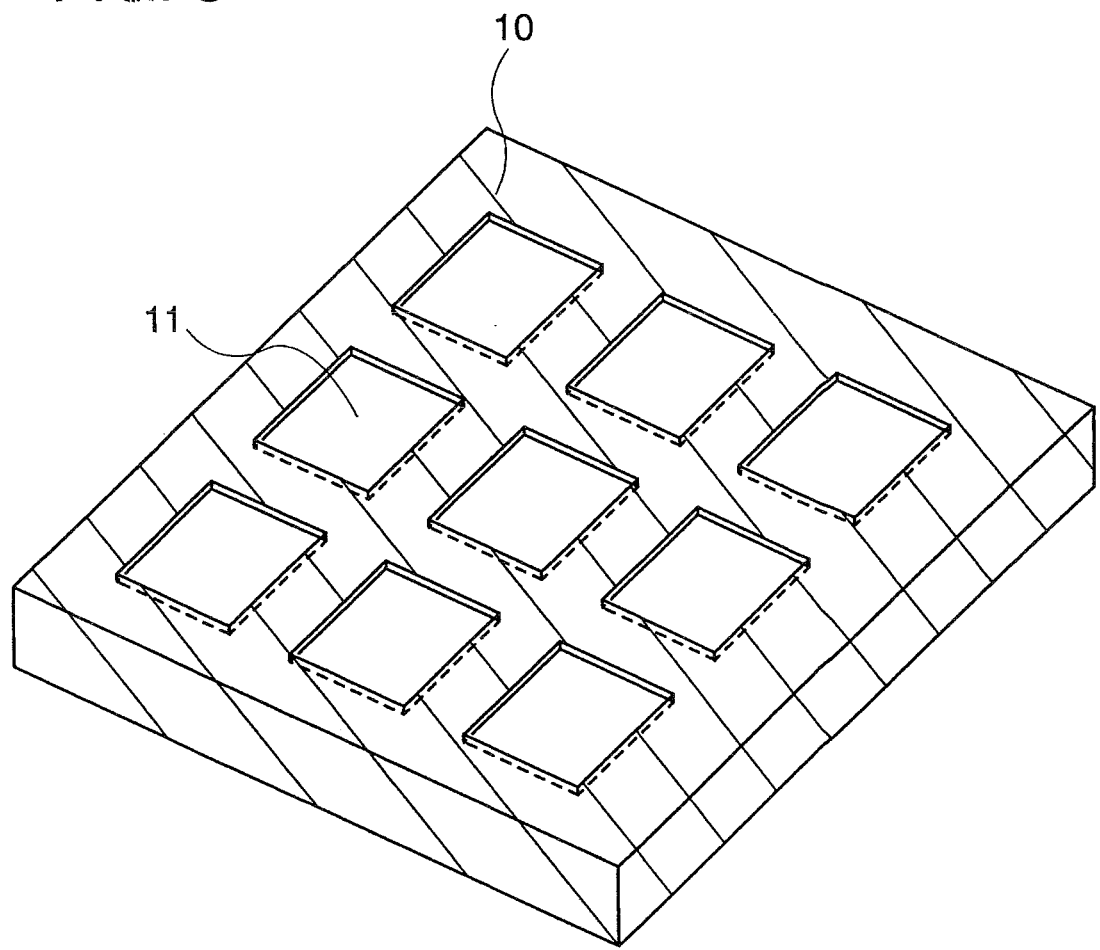
FIG. 3 is a diagram showing an example of a tray.
Figure 4:
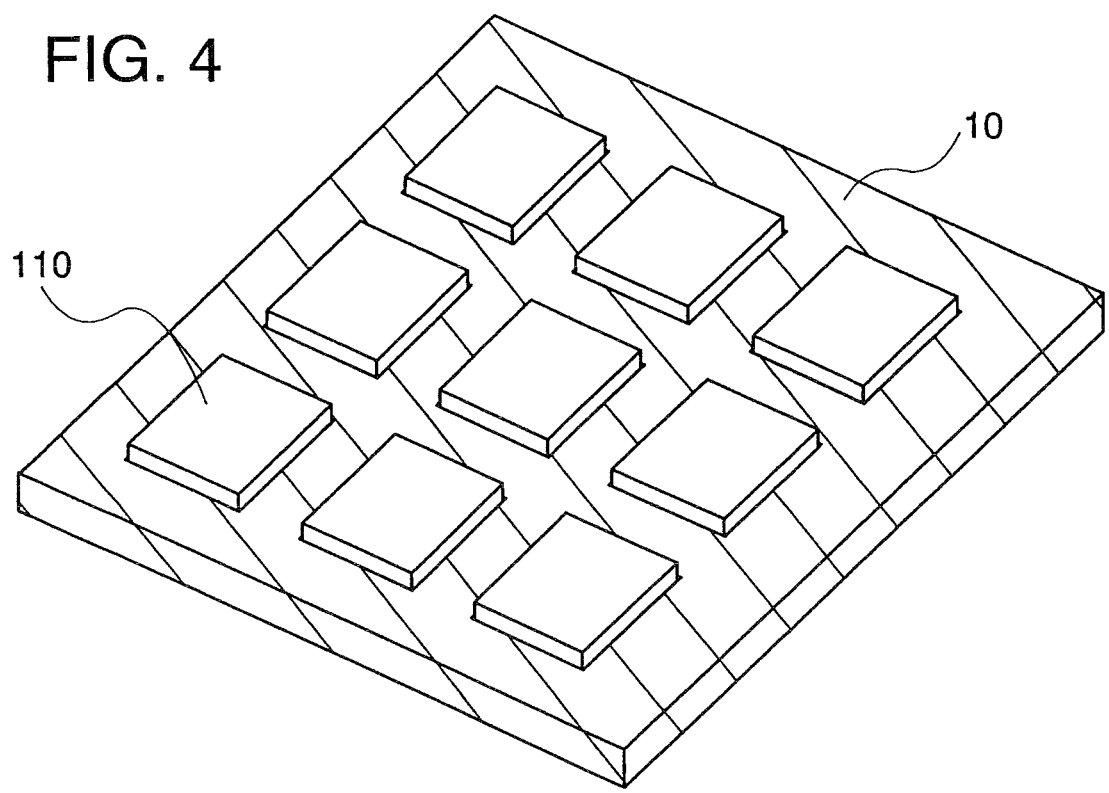
FIG. 4 is a diagram showing a state where single crystal semiconductor substrates are arranged in a tray.

After washing the single crystal semiconductor substrate 110, a plurality of single crystal semiconductor substrates 110 are arranged in a tray 10. FIG. 3 is an external view showing an example of a structure of the tray 10. The tray 10 is a plate-like member, in which a plurality of depressions 11 for holding the single crystal semiconductor substrates 110 are provided. In the tray 10 shown in FIG. 3, the depressions 11 are formed in three rows and three columns. It is needless to say that the present invention is not interpreted as being limited to the structure, and the number of rows and columns can be changed as appropriate. With the use of the tray 10, the single crystal semiconductor substrates 110 are arranged in the depressions 11 of the tray 10 as shown in FIG. 4.

The tray 10 is formed from a material which does not change in shape and property by heat treatment in a process for manufacturing the semiconductor substrate 100. In particular, it is preferable to select a material with less heat expansion. For example, the tray 10 can be manufactured using quartz glass or stainless steel.

The thickness of the tray 10 can be set to be, for example, greater than or equal to 1.1 mm and less than or equal to 2 mm. Of course, the thickness of the tray 10 is not limited thereto as long as a certain level of strength can be ensured. The depth of the depression 11 can be set to be, for example, greater than or equal to 0.2 mm and less than or equal to 0.6 mm, preferably greater than or equal to 0.3 mm and less than or equal to 0.5 mm. Note that the depth of the depression 11 is acceptable as long as the single crystal semiconductor substrate 110 can be held therein, and not limited to the above-described depth.

The size of the tray 10 is preferably set to be the same as or substantially the same as the size of the base substrate 101. This is because alignment at the time of bonding is facilitated by setting the size of the tray 10 to be the same as or substantially the same as the size of the base substrate. The depression 11 is made to have a size enough for the single crystal semiconductor substrate 110 to fit in the depression 11. Preferably, the size of the depression 11 is set to be the same as or substantially the same as the size of the single crystal semiconductor substrate 110. For example, a side of the depression 11 and a corresponding side of the single crystal semiconductor substrate 110 are set so that a difference in length is at most 0.5 mm. In this manner, the size of the depression 11 is set to be the same as or substantially the same as the size of the single crystal semiconductor substrate 110, whereby positional accuracy at the time of bonding can be drastically improved. Note that in the manufacturing method of this embodiment mode, the size and arrangement of the single crystal semiconductor layers 116 in the semiconductor substrate 100 are determined depending on the size and arrangement of the depressions 11.

Figure 5A:
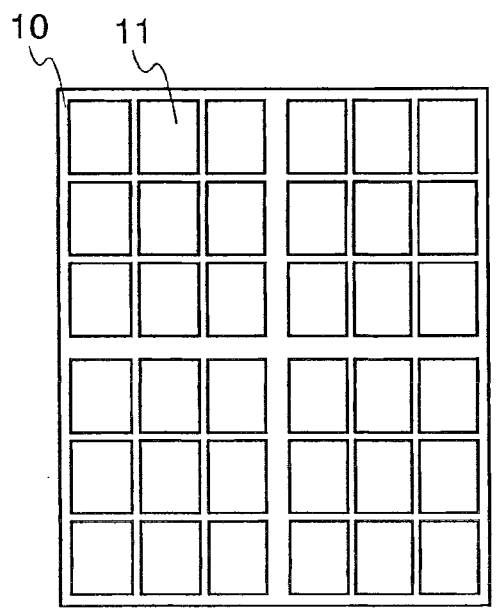
FIGS. 5A and 5B are diagrams each showing an example of a tray.
Figure 5B:
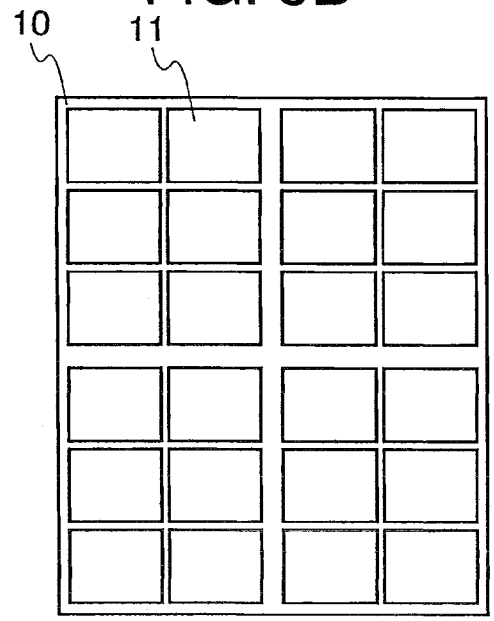
Figure 6A:
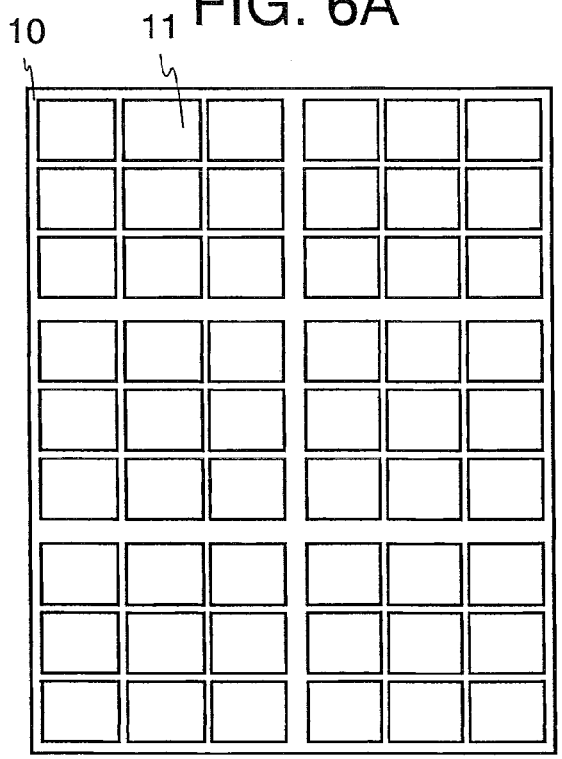
FIGS. 6A and 6B are diagrams each showing an example of a tray.
Figure 6B:
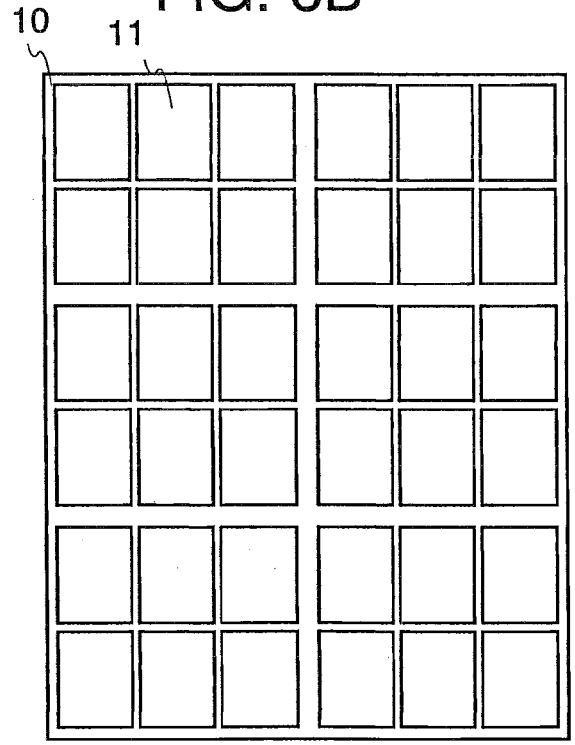

FIGS. 5A and 5B and FIGS. 6A and 6B are top views showing structural examples of the tray 10. FIGS. 5A and 5B are plan views of the tray 10 in the case of using mother glass having a size of 600 mm×720 mm as the base substrate 101, and the size of the tray 10 is 600 mm×720 mm, which is the same as that of the mother glass. FIGS. 6A and 6B are plan views of the tray 10 in the case of using 4th generation mother glass having a size of 730 mm×920 mm as the base substrate 101, and the size of the tray 10 is 730 mm×920 mm, which is the same as that of the mother glass.

FIG. 5A is a plan view of the tray 10, in which the size and arrangement of the depressions 11 are taken into consideration so as to correspond to a stepper with a light exposure region of 4 square inches. The tray 10 is sectioned into four blocks, and each block is provided with nine depressions 11 arranged in three rows and three columns. The size of each depression 11 is 102 mm×82 mm, which fits in a light exposure region for one shot. In each block, the distance between the depressions 11 is 11 mm in both a longitudinal and a lateral direction, and the distance between the edge of the tray 10 and the depression 11 is 16 mm in both a longitudinal direction and a lateral direction.

FIG. 5B is a plan view of the tray 10, in which the size and arrangement of the depressions 11 are taken into consideration so as to correspond to a stepper with a light exposure region of 5 square inches. The tray 10 is sectioned into four blocks, and each block is provided with six depressions 11 arranged in three rows and two columns. The size of each depression 11 is 102 mm×130 mm, which fits in a light exposure region for one shot. In each block, the distance between the depressions 11 in a longitudinal direction is 11 mm and the distance between the depressions 11 in a lateral direction is 10 mm. The distance between the edge of the tray 10 and the depression 11 is 16 mm in both a longitudinal direction and a lateral direction.

FIG. 6A is a plan view of the tray 10, in which the size and arrangement of the depressions 11 are taken into consideration so as to correspond to a stepper with a light exposure region of 4 square inches. The tray 10 is sectioned into six blocks, and each block is provided with nine depressions 11 arranged in three rows and three columns. The size of each depression 11 is 105 mm×84 mm, which fits in a light exposure region for one shot. In each block, the distance between the depressions 11 in a longitudinal direction is 11 mm and the distance between the depressions 11 in a lateral direction is 10 mm. The distance between the edge of the tray 10 and the depression 11 in a longitudinal direction is 16 mm, and the distance between the edge of the tray 10 and the depression 11 in a lateral direction is 15 mm.

FIG. 6B is a plan view of the tray 10, in which the size and arrangement of the depressions 11 are taken into consideration so as to correspond to a stepper with a light exposure region of 5 square inches. The tray 10 is sectioned into six blocks, and each block is provided with six depressions 11 arranged in two rows and three columns. The size of each depression 11 is 132 mm×105 mm, which fits in a light exposure region for one shot. In each block, the distance between the depressions 11 in a longitudinal direction is 13 mm and the distance between the depressions 11 in a lateral direction is 10 mm. The distance between the edge of the tray 10 and the depression 11 is 15 mm in both a longitudinal direction and a lateral direction.

Note that the above-described structures of the tray 10 are just examples, and the present invention is not interpreted as being limited to the structure. For example, a structure may be used in which the single crystal semiconductor substrates 110 are continuously arranged, with the distance between the depressions 11 in each block narrowed. Further, a larger tray can be used to be adapted to larger mother glass.

Figure 7A:
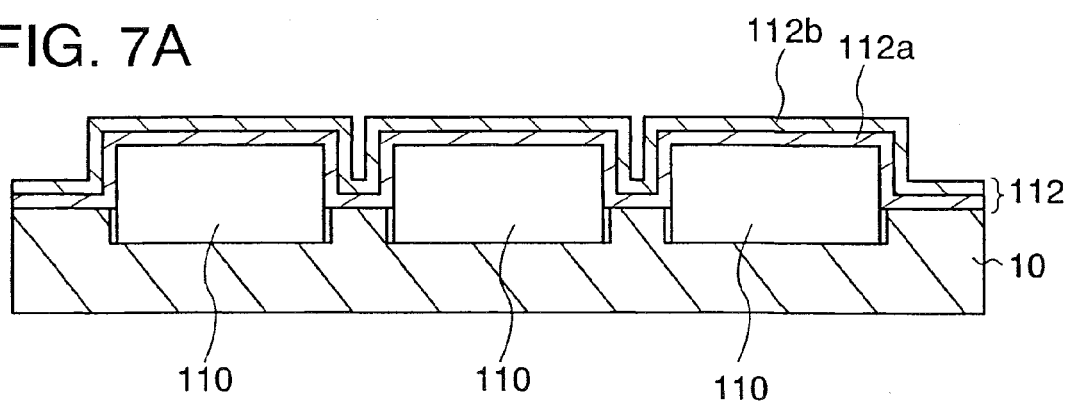
FIGS. 7A to 7D are cross-sectional views showing a method for manufacturing an SOI substrate.

After the single crystal semiconductor substrates 110 are arranged in the tray 10 as shown in FIG. 4, an insulating layer 112 is formed over the single crystal semiconductor substrates 110 as shown in FIG. 7A. For the insulating layer 112, a single-layer structure or a multilayer structure including two or more layers can be used. The thickness of the insulating layer 112 can be set in the range of from 5 nm to 400 nm inclusive. As a manufacturing method, a CVD method, a sputtering method, a method for oxidizing or nitriding surfaces of the single crystal semiconductor substrates 110, and the like can be given. As a film included in the insulating layer 112, an insulating film containing silicon or germanium as its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide, such as an aluminum oxide film, a tantalum oxide film, or a hafnium oxide film; an insulating film including a metal nitride, such as an aluminum nitride film; an insulating film including a metal oxynitride, such as an aluminum oxynitride film; or an insulating film including a metal nitride oxide, such as an aluminum nitride oxide film can also be used.

Here, a silicon oxynitride means the one that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, a silicon nitride oxide film shows a film that has greater content of nitrogen than that of oxygen, and for example, silicon nitride oxide includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The aforementioned ranges are ranges for cases measured using Rutherford backscattering spectrometry (RBS) and hydrogen forward scattering (HFS). Moreover, the total for the content ratio of the constituent elements is taken to be a value that does not exceed 100 at. %.

When a substrate including an impurity which decreases the reliability of a semiconductor device, such as alkali metal or alkaline earth metal, is used as the base substrate 101, the insulating layer 112 preferably includes at least one film capable of preventing diffusion of the impurity from the base substrate 101 into the semiconductor layer of the SOI substrate. As such a film, a silicon nitride film, a silicon nitride oxide film, an aluminum nitride film, an aluminum nitride oxide film, and the like can be given. By including such a film, the insulating layer 112 can function as a barrier layer.

For example, in the case of forming the insulating layer 112 as a barrier layer with a single-layer structure, the insulating layer 112 may be formed of a silicon nitride film, a silicon nitride oxide film, an aluminum nitride film, or an aluminum nitride oxide film each having a thickness of from 5 nm to 200 nm inclusive.

In the case of forming the insulating layer 112 as a barrier layer with a two-layer structure, the upper layer is formed of an insulating film with a high barrier property. For example, a silicon nitride film, a silicon nitride oxide film, an aluminum nitride film, or an aluminum nitride oxide film each having a thickness of approximately from 5 nm to 200 nm inclusive can be used. Such a film has a high blocking effect for preventing impurity diffusion, and in addition, the internal stress is high. Therefore, it is preferable that a film having an effect of relieving the stress of the upper insulating film be selected as a lower insulating film which is in contact with the single crystal semiconductor substrates 110. As such a film, a silicon oxide film, a silicon oxynitride film, a thermal oxide film formed by thermally oxidizing the single crystal semiconductor substrate 110, and the like is given. The thickness of the lower insulating film can be set to be approximately greater than or equal to 5 nm and less than or equal to 300 nm, for example.

In this embodiment mode, the insulating layer 112 has a two-layer structure including the insulating film 112a and the insulating film 112b. As a combination of the insulating film 112a and the insulating film 112b when the insulating layer 112 functions as a barrier layer, for example, the following combinations are given: a silicon oxide film and a silicon nitride film, a silicon oxynitride film and a silicon nitride film, a silicon oxide film and a silicon nitride oxide film, a silicon oxynitride film and a silicon nitride oxide film, and the like.

For example, as the lower insulating film 112a, a silicon oxynitride film formed using $SiH_4$ and $N_2O$ as a process gas by a plasma enhanced CVD method (hereinafter, also referred to as a PECVD method) can be used. Alternatively, a silicon oxide film formed using an organosilane gas and oxygen as a process gas by a PECVD method may be used. Further alternatively, an oxide film formed by oxidizing the single crystal semiconductor substrate 110 may be used as the insulating film 112a.

The organosilane refers to organic compounds each containing a silicon atom, such as tetraethyl orthosilicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

As the upper insulating film 112b, a silicon nitride oxide film formed using $SiH_4$, $N_2O$, $NH_3$, and $H_2$ as a process gas by a PECVD method can be used, for example. Alternatively, a silicon nitride film formed using $SiH_a$, $N_2$, $NH_3$, and $H_2$ as a process gas by a PECVD method may be used.

In the case of forming the insulating film 112a made of silicon oxynitride and the insulating film 112b made of silicon nitride oxide by a PECVD method, for example, the following method can be employed: the plurality of single crystal semiconductor substrates 110 arranged in the tray 10 are transferred to a treatment chamber of a PECVD apparatus, plasma of a mixed gas of $SiH_4$ and $N_2O$ is produced, and a silicon oxynitride film is formed over the single crystal semiconductor substrate 110; then, a gas to be introduced into the treatment chamber is changed to $SiH_4$, $N_2O$, $NH_3$, and $H_2$, and plasma of the mixed gas of these is produced, so that a silicon nitride oxide film can be successively formed over the silicon oxynitride film. In the case of using a PECVD apparatus with a plurality of treatment chambers, a silicon oxynitride film and a silicon nitride oxide film can be formed in different treatment chambers. Of course, a silicon oxide film can be formed in the lower layer and a silicon nitride film can be formed in the upper layer by changing a gas to be introduced into a treatment chamber.

The insulating film 112a and the insulating film 112b are formed in the manner described above, whereby the insulating layer 112 can be formed over the plurality of single crystal semiconductor substrates 110 with high throughput. Further, the insulating film 112a and the insulating film 112b can be formed without being exposed to the air; thus, an interface between the insulating film 112a and the insulating film 112b can be prevented from being contaminated by the air.

Further, as the insulating film 112a, an oxide film formed by subjecting the single crystal semiconductor substrate 110 to oxidation treatment can be used. Dry oxidation may be used as thermal oxidation treatment for forming the oxide film; however, a gas including halogen is preferably added to an oxidizing atmosphere. As the gas including halogen, one or more kinds of gases selected from HCl, HF, $NF_3$, HBr, Cl, ClF, $BCl_3$, F, $Br_2$, or the like can be used.

For example, heat treatment is performed at a temperature of greater than or equal to 700° C. in an atmosphere containing HCl at a proportion of from 0.5 volume % to 10 volume % inclusive (preferably, approximately 3 volume %) with respect to oxygen. As an example, thermal treatment may be performed at a heating temperature of greater than or equal to 950° C. and less than or equal to 1100° C. The treatment time can be 0.1 to 6 hours inclusive, preferably 0.5 to 1 hour inclusive. The film thickness of an oxide film which is to be formed can be 10 nm to 1000 nm inclusive (preferably, 50 nm to 200 nm inclusive), for example, 100 nm.

By oxidation treatment being performed at such a temperature range, a gettering effect (an effect of removing a metal impurity) with a halogen element can be obtained. That is, with action of chlorine, an impurity such as a metal turns into a volatile chloride and is released into a gas phase, thereby being removed from the single crystal semiconductor substrate 110. Further, a defect in a surface of the single crystal semiconductor substrate 110 is terminated by the halogen element included in the oxidizing atmosphere; thus, local level density at an interface between the oxide film and the single crystal semiconductor substrate 110 can be reduced.

By thermal oxidation treatment in the atmosphere containing halogen, halogen can be contained in the oxide film. The halogen element is contained at a concentration of approximately $1\times10^{17}$ atoms/cm$^3$ to $5\times10^{20}$ atoms/cm$^3$ inclusive, thereby trapping an impurity such as a metal to function as a protective film, which prevents contamination of the single crystal semiconductor layer 116, in the semiconductor substrate 100.

In the case of forming the lower insulating film 112a by thermal oxidation treatment and forming the upper insulating film 112b by a gas phase method such as a PECVD method, the insulating film 112a can be formed by thermal oxidation treatment before the single crystal semiconductor substrates 110 are arranged in the tray 10, the single crystal semiconductor substrates 110 provided with the insulating films 112a can be arranged in the tray 10, and then, the insulating film 112b can be formed.

Figure 7B:
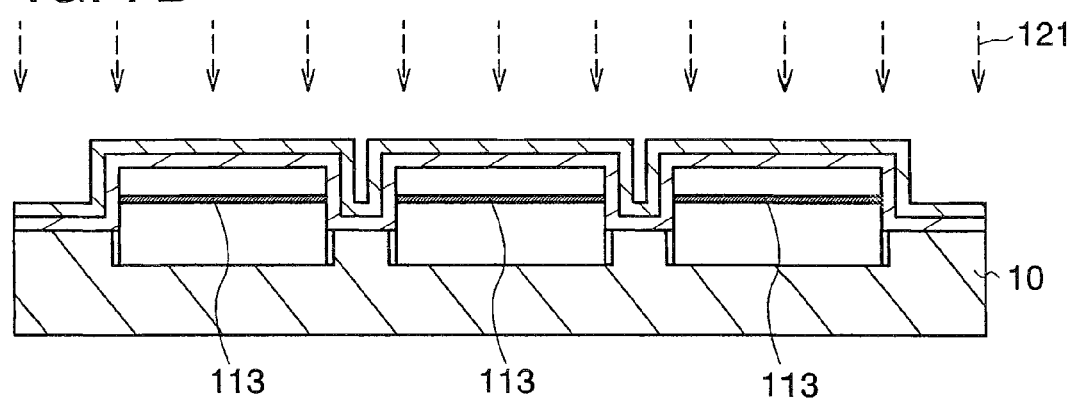

Next, as shown in FIG. 7B, each of the single crystal semiconductor substrates 110 is irradiated with an ion beam 121 including ions accelerated by an electric field through the insulating layer 112, whereby a damaged region (also referred to as an embrittled region) 113 is formed in the single crystal semiconductor substrate 110 at a predetermined depth from the surface thereof. A depth of a region to be the damaged region 113 is the same as or substantially the same as an average depth of penetration of ions, and can be controlled by acceleration energy of the ion beam 121 and an incident angle of the ion beam 121. The acceleration energy can be controlled by an acceleration voltage, dosage, or the like. Note that the thickness of a semiconductor layer separated from the single crystal semiconductor substrate 110 is determined depending on the depth of the damaged region 113. The depth at which the damaged region 113 is formed may range from 50 nm to 500 nm inclusive, preferably from 50 nm to 200 nm inclusive.

As a method for irradiating the single crystal semiconductor substrate 110 with ions, it is more preferable to use an ion doping method in which mass separation is not performed than an ion implantation method in which mass separation is performed. This is because a takt time, in which the damaged regions 113 are formed in the plurality of single crystal semiconductor substrates 110 arranged in the tray 10 having a large size (having a large area), can be shortened by using an ion doping method.

In the case of using an ion doping method, the single crystal semiconductor substrates 110 which have been fitted in the tray 10 are transferred to a treatment chamber of an ion doping apparatus. Plasma is produced by exciting a process gas, desired ions are extracted from the plasma and accelerated to generate the ion beam 121, and the plurality of single crystal semiconductor substrates 110 are irradiated with the ion beam 121, whereby ions are introduced at a predetermined depth to form a high concentration region. Thus, the damaged regions 113 are formed.

When hydrogen ($H_2$) is used for a source gas, $H^+$, $H_2^+$, and $H_3^+$ can be produced by exciting a hydrogen gas. The proportion of ion species produced from a source gas can be changed by regulating an excitation method for plasma, a pressure of an atmosphere for producing plasma, a supply of the source gas, or the like. In the case of performing ion irradiation by an ion doping method, the proportion of the amount of contained $H_3^+$ in the total amount of ions in the ion beam 121 is at least 50% or more, preferably 70% or more, more preferably 80% or more. The proportion of $H_3^+$ is made to be 50% or more, whereby the proportion of $H^+$ and $H_2^+$ which are contained in the ion beam 121 becomes comparatively small. Therefore, variation in an average depth of penetration of the hydrogen ions contained in the ion beam 121 can be reduced. Thus, penetration efficiency of ions can be improved and the takt time can be shortened. Further, since $H_3^+$ has a larger mass than $H^+$ and $H_2^+$, a damaged region can be formed at a shallow depth when an acceleration voltage is the same (that is, when energy of ions is the same). That is, the thickness of the semiconductor layer can be reduced. Note that a profile of $H_3^+$ in the semiconductor substrate is steeper than $H^+$ and $H_2^+$. Thus, separation can be favorably performed even when the total amount of irradiation is small.

In the case of performing ion irradiation by an ion doping method with the use of the hydrogen gas as the source gas, the acceleration voltage can be set in the range of approximately from 10 kV to 200 kV inclusive, and the dosage is set in the range of approximately from $1 \times 10^{16}$ ions/cm$^2$ to $6 \times 10^{16}$ ions/cm$^2$ inclusive. By the irradiation with the hydrogen ions under this condition, the damaged region 113 can be formed at a depth of from 50 nm to 500 nm inclusive in the single crystal semiconductor substrate 110, though depending on the ion species in the ion beam 121 and their proportion.

For example, in the case where the single crystal semiconductor substrate 110 is a single crystal silicon substrate; the insulating film 112a is a 50-nm-thick silicon oxynitride film; and the insulating film 112b is a 50-nm-thick silicon nitride oxide film, a single crystal semiconductor layer with a thickness of about 120 nm can be separated from the single crystal semiconductor substrate 110 under the following condition; a source gas is hydrogen, the acceleration voltage is 40 kV, and the dosage is $2.2 \times 10^{16}$ ions/cm$^2$. Alternatively, when the irradiation with the hydrogen ions is performed under the aforementioned condition except that the insulating film 112a is a 100-nm-thick silicon oxynitride film, a semiconductor layer with a thickness of about 70 nm can be separated from the single crystal semiconductor substrate 110.

Alternatively, as the source gas of the ion beam 121, helium (He) may be used. Since most of the ion species produced by exciting helium are $He^+$, the single crystal semiconductor substrates 110 can be irradiated with $He^+$ as main ions even in an ion doping method in which mass separation is not performed. Therefore, the damaged regions 113 can be formed efficiently by an ion doping method. When ion irradiation is performed by an ion doping method using helium, the acceleration voltage may be set in the range of from 10 kV to 200 kV inclusive, and the dosage may be set in the range of from $1 \times 10^{16}$ ions/cm$^2$ to $6 \times 10^{16}$ ions/cm$^2$ inclusive. Further alternatively, a halogen gas such as a chlorine gas ($Cl_2$ gas) or a fluorine gas ($F_2$ gas) can be used as the source gas.

Figure 7C:
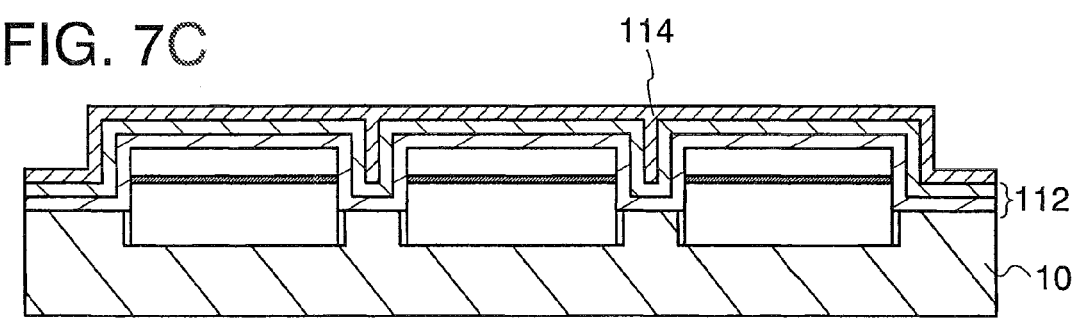

After forming the damaged region 113, a bonding layer 114 is formed over the top surface of the insulating layer 112 as shown in FIG. 7C. In a process for forming the bonding layer 114, the heat temperature of the single crystal semiconductor substrate 110 is set at a temperature at which an element or a molecule with which the damaged regions 113 are irradiated is not precipitated, and the heat temperature is preferably 400° C. or less, more preferably 350° C. or less. In other words, the damaged regions 113 do not release gas within this heat temperature range. Note that the bonding layer 114 can be formed before the ion irradiation process. In this case, the process temperature at the time of forming the bonding layer 114 can be set to 350° C. or more.

The bonding layer 114 is a layer having a smooth and hydrophilic surface. Arithmetic mean roughness Ra of the bonding layer 114 is less than or equal to 0.7 nm, preferably less than or equal to 0.4 nm. Further, the thickness of the bonding layer 114 can be set to be greater than or equal to 5 nm and less than or equal to 500 nm, more preferably greater than or equal to 10 nm and less than or equal to 200 nm.

As the bonding layer 114, an insulating film formed by a chemical gas phase reaction is preferably used, and a silicon oxide film is especially preferred. In the case of forming a silicon oxide film as the bonding layer 114 by a plasma enhanced CVD method, it is preferable to use an organosilane gas and an oxygen ($O_2$) gas as a source gas. By using organosilane as the source gas, it is possible to form a silicon oxide film having a smooth surface at a process temperature of 400° C. or less.

For example, in order to form the bonding layer 114 formed of a silicon oxide film using TEOS and $O_2$ as the source gas, the following condition may be employed: the flow rate of TEOS is 15 sccm, the flow rate of $O_2$ is 750 sccm, the film formation pressure is 100 Pa, the film formation temperature is 300° C., the power frequency is 13.56 MHz, and the RF output is 300 W.

A silicon oxide film functioning as the bonding layer 114 can be formed by a thermal CVD method other than a plasma enhanced CVD method. In this case, monosilane ($SiH_4$), disilane ($Si_2H_6$), or the like can be used as the silicon source gas, and an oxygen ($O_2$) gas, a dinitrogen monoxide ($N_2O$) gas, or the like can be used as the oxygen source gas. The heating temperature is preferably greater than or equal to 200° C. and less than or equal to 500° C. Note that the bonding layer 114 is mostly formed from an insulating material, and the bonding layer 114 is broadly included in an insulating layer. It is likely that the bonding layer 114 which is formed in a manner like the above-described method is favorable for bonding at a low temperature. This is because an OH group is present at a surface of the above-describe bonding layer 114. Although a mechanism relating to bonding is not completely resolved, it is likely that Si—O—Si is formed by reaction of Si—OH and Si—OH, or Si—O—Si is formed by reaction of Si—H and Si—OH. On the other hand, at a surface of the bonding layer 114 formed by a thermal oxidation method or the like, the number of OH groups is small. Thus, the bonding layer 114 formed by a thermal oxidation method is not suitable for bonding at a low temperature.

Figure 7D:
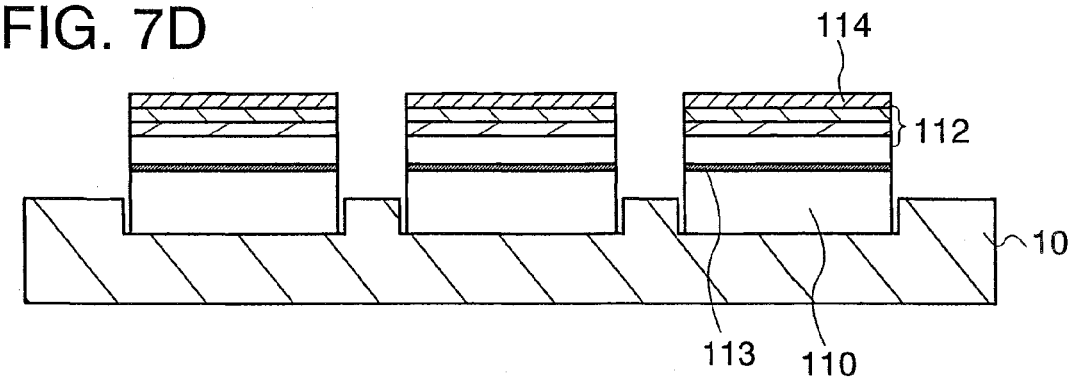

Next, the single crystal semiconductor substrates 110 provided with the insulating layer 112 and the bonding layer 114 are detached from the tray 10, and the plurality of single crystal semiconductor substrates 110 are cleaned. The cleaning process can be performed by ultrasonic cleaning using pure water. As the ultrasonic cleaning, megahertz ultrasonic cleaning (megasonic cleaning) is preferable. The single crystal semiconductor substrates 110 may be cleaned with ozone water after the ultrasonic cleaning. By cleaning with the use of ozone water, organic substances can be removed and surface activation treatment which improves a hydrophilic property of the surface of the bonding layer 114 can be performed. After terminating the cleaning treatment and the surface activation treatment, the single crystal semiconductor substrates 110 are arranged in the depressions 11 of the tray 10 as shown in FIG. 7D. Note that this embodiment mode describes a case where the single crystal semiconductor substrates 110 are detached from the tray 10 and are subjected to the cleaning treatment and the activation treatment; however, the present invention is not interpreted as being limited thereto. In the case where contamination of the single crystal semiconductor substrates 110 or the like does not become a problem, it is not necessary to clean the single crystal semiconductor substrates 110. Further, even when the cleaning treatment and the surface activation treatment are performed, the treatment can be performed without detaching the single crystal semiconductor substrates 110 from the tray 10.

As the activation treatment of the surface of the bonding layer 114, irradiation treatment with an atomic beam or an ion beam, plasma treatment, radical treatment, and the like can be given as well as cleaning with ozone water. When an atomic beam or an ion beam is used, an inert gas neutral atom beam or an inert gas ion beam of argon or the like can be used.

Next, the single crystal semiconductor substrates 110 arranged in the tray 10 are bonded to the base substrate 101.

Before the bonding, the base substrate 101 is preferably cleaned. As the cleaning of the base substrate 101, cleaning with a hydrochloric acid and a hydrogen peroxide solution, megahertz ultrasonic cleaning, and the like are given. Further, surface activation treatment is preferably performed on a surface to be a bonding surface of the base substrate 101 in a manner similar to the bonding layer 114.

Figure 8A:
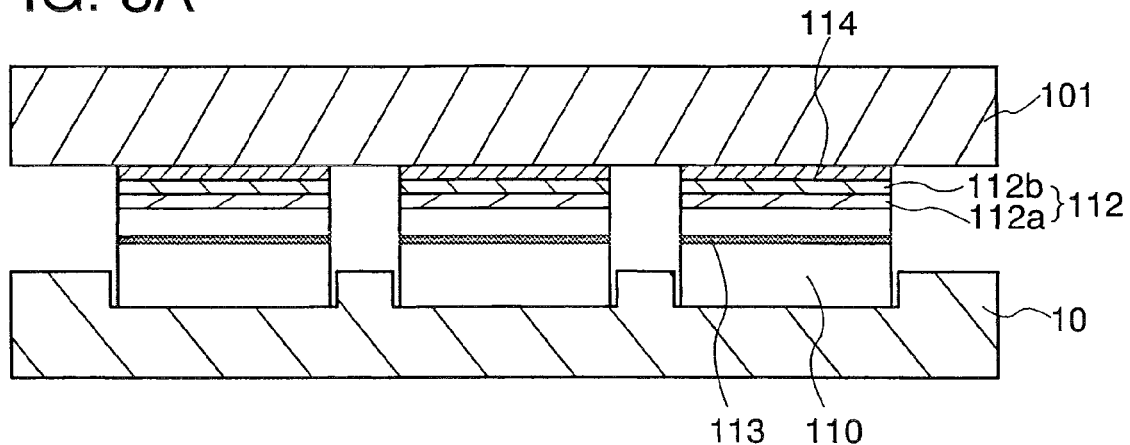
FIGS. 8A and 8B are cross-sectional views showing a method for manufacturing an SOI substrate.

FIG. 8A is a cross-sectional view illustrating a bonding process. The base substrate 101 is disposed with respect to the tray 10 in which the plurality of single crystal semiconductor substrates 110 are arranged. Then, a pressure of approximately greater than or equal to 300 $N/cm^2$ and less than or equal to 15000 $N/cm^2$ is applied to a predetermined portion (for example, an edge portion) of the base substrate 101. The pressure is preferably approximately greater than or equal to 1000 $N/cm^2$ and less than or equal to 5000 $N/cm^2$. By application of pressure, the bonding layer 114 and the base substrate 101 start to be disposed in close contact with each other from a portion to which pressure is applied. After a while, all the single crystal semiconductor substrates 110 in the tray 10 are disposed in close contact with one base substrate, which is the base substrate 101. Since the bonding process does not need heat treatment and can be performed at room temperature, a substrate with low heat resistance, such as a glass substrate, can be used as the base substrate 101.

Note that in the present invention, the plurality of single crystal semiconductor substrates 110 are arranged in the tray 10; thus, there may be a case of generating the single crystal semiconductor substrate 110 which is not in contact with the base substrate 101 due to a difference in a thickness of the single crystal semiconductor substrates 110. Therefore, pressure is preferably applied to a plurality of places, not to one place. More preferably, pressure is applied to each of the single crystal semiconductor substrates 110. Note that even in the case where there is a variation in height of surfaces of the bonding layers 114 to some degree in the state where the single crystal semiconductor substrates 110 are arranged in the tray 10, bonding can be made to proceed throughout the surface of the bonding layer 114 even if part of the bonding layer 114 comes in contact with the base substrate 101 due to warpage of the base substrate 101.

Figure 9:
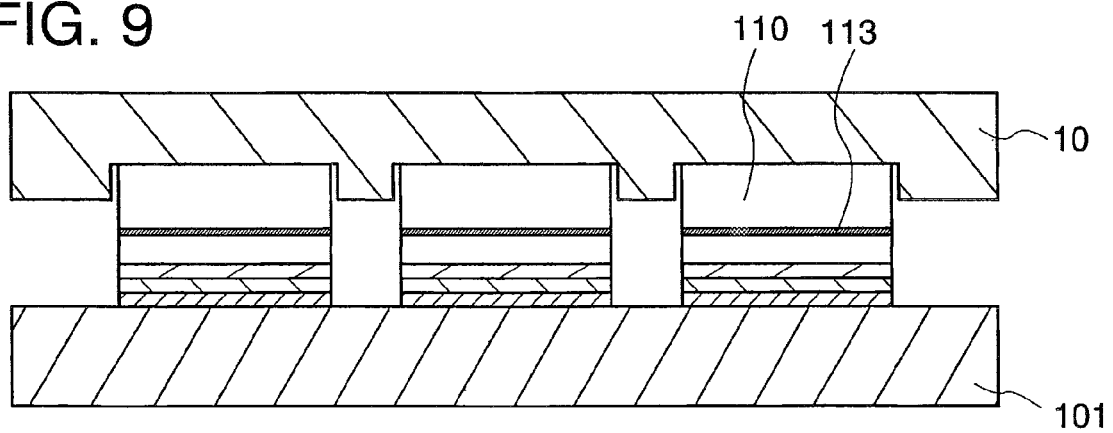
FIG. 9 is a cross-sectional view showing a method for manufacturing an SOI substrate.

Further, after putting the base substrate 101 on the tray 10 as shown in FIG. 8A, the resulting structure is inverted so that the base substrate 101 comes to the lower side as shown in FIG. 9. Thus, the base substrate 101 and the single crystal semiconductor substrates 110 can be made to come in contact with each other due to self weights of the single crystal semiconductor substrates 110. Accordingly, a bond can be easily formed regardless of a difference in a thickness of the single crystal semiconductor substrates 110.

After bonding the base substrate 101 and the single crystal semiconductor substrates 110 to each other, heat treatment is preferably performed in order to increase a bonding force at the bonding interface between the base substrate 101 and each of the bonding layers 114. The heat treatment can be performed at a temperature at which the damaged region 113 does not crack, for example, at a temperature in the range of 200° C. to 450° C. inclusive. By bonding the single crystal semiconductor substrates 110 to the base substrate 101 while heating at a temperature in the above-described range, a bonding force at the bonding interface between the base substrate 101 and the bonding layer 114 can be increased.

If a bonding surface is contaminated by dust or the like in disposing the base substrate 101 over the single crystal semiconductor substrates 110, bonding is not performed in the contaminated portion. In order to prevent such contamination of the bonding surface, it is preferable that the base substrate 101 be disposed over the single crystal semiconductor substrates 110 in a treatment chamber with an airtight structure (an airtight chamber). Further, it is preferable that the treatment chamber be in a state with reduced pressure of approximately $5.0 \times 10^{-3}$ Pa and an atmosphere in which bonding treatment is performed be cleaned.

Figure 8B:
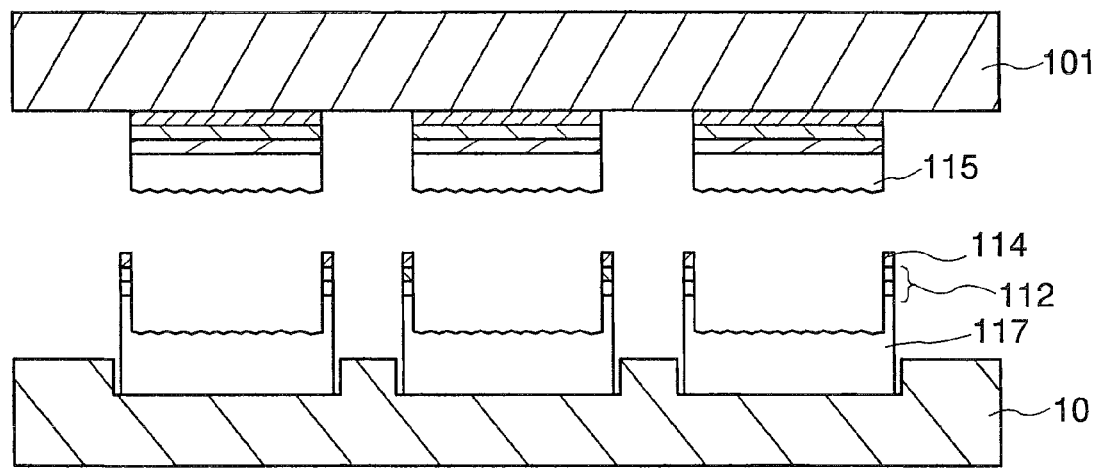

Then, heat treatment is performed, and separation is made to occur in the damaged region 113; thus, semiconductor layers 115 are separated from the single crystal semiconductor substrates 110. FIG. 8B is a diagram illustrating a separation process in which the semiconductor layers 115 is separated from the single crystal semiconductor substrates 110. Note that here, single crystal semiconductor substrates from which the semiconductor layers 115 have been separated is referred to as single crystal semiconductor substrates 117.

By the heat treatment, an element which is present in the damaged region 113 is precipitated, and pressure in microvoids of the damaged region 113 is increased. Due to the increase in pressure, the microvoids of the damaged region 113 change in volume, and the damaged region 113 is cracked. Accordingly, the single crystal semiconductor substrate 110 is cleaved along the damaged region 113. Since the bonding layers 114 is bonded to the base substrate 101, the semiconductor layers 115 separated from the single crystal semiconductor substrates 110 is fixed to the base substrate 101. The temperature of the heat treatment for separating the semiconductor layers 115 from the single crystal semiconductor substrates 110 is set so as not to exceed the strain point of the base substrate 101.

For the heat treatment, a rapid thermal anneal (RTA) apparatus, a resistant-heating furnace, a microwave heating apparatus, or the like can be used. For an RTA apparatus, a gas rapid thermal anneal (GRTA) apparatus and a lamp rapid thermal anneal (LRTA) apparatus are given.

In the case of using a GRTA apparatus, heat treatment at a heating temperature of greater than or equal to 550° C. and less than or equal to 650° C. and with treatment time of greater than or equal to 0.5 minutes and less than or equal to 60 minutes can be applied. In the case of using a resistant-heating apparatus, heat treatment at a heating temperature of greater than or equal to 200° C. and less than or equal to 650° C. and with treatment time of greater than or equal to 2 hours and less than or equal to 4 hours can be applied. In the case of using a microwave processing apparatus, a microwave frequency is set to 2.45 GHz and heat treatment with treatment time of greater than or equal to 10 minutes and less than or equal to 20 minutes can be applied.

A specific method of heat treatment using a vertical furnace having a resistant-heating device is described. First, the base substrate 101 provided with the single crystal semiconductor substrates 110 arranged in the tray 10 is disposed in a boat of a vertical furnace. The boat is transferred to a chamber of the vertical furnace. The inside of the chamber is set to a vacuum state (a reduced-pressure state) in order to suppress oxidation of the single crystal semiconductor substrates 110. The degree of vacuum may be set to be approximately $5 \times 10^{-3}$ Pa. After setting the chamber to a vacuum state, nitrogen is supplied to the chamber, so that the chamber is made to have a nitrogen atmosphere under an atmospheric pressure. During this process, the temperature is increased to 200° C.

After heating at a temperature of 200° C. for two hours, the temperature is increased to 400° C. over one hour. When the state at a temperature of 400° C. becomes stable, the temperature is increased to 600° C. over another hour. When the state at a temperature of 600° C. becomes stable, heat treatment is performed at 600° C. for two hours. Then, the temperature is decreased to 400° C. over one hour, and after 10 to 30 minutes, the boat is transferred from the inside of the chamber. Next, under the atmospheric atmosphere, the single crystal semiconductor substrates 117 arranged in the tray 10, and the base substrate 101 provided with the semiconductor layers 115 on the boat are cooled.

In the heat treatment using the resistant-heating furnace, heating treatment for increasing a bonding force between each of the bonding layers 114 and the base substrate 101 and heat treatment for causing separation in the damaged region 113 are successively performed. In the case of performing these two heat treatments with the use of different apparatuses, the following process can be performed, for example. First, heat treatment is performed at 200° C. for 2 hours using a resistant-heating furnace. Then, the base substrate 101 and the single crystal semiconductor substrates 110, which are bonded to each other, are transferred from the furnace; then, heat treatment is performed at a temperature greater than or equal to 600° C. and less than or equal to 700° C. for 1 minute to 30 minutes inclusive, using an RTA apparatus. Through the above-described process, the single crystal semiconductor substrates 110 can be cleaved in the damaged regions 113.

Note that as shown in FIG. 8B, there are many cases in which a peripheral portion of the single crystal semiconductor substrate 110 is not bonded to the base substrate 101. It is likely that this is due to the following reasons: the base substrate 101 and the bonding layer 104 are not disposed in close contact with each other because the peripheral portion of the single crystal semiconductor substrate 110 is chamfered and has a curvature; the damaged region 113 is not easily divided in the peripheral portion of the single crystal semiconductor substrate 110; the peripheral portion has not enough planarity; the peripheral portion has a flaw or dirt; or the like. Therefore, the semiconductor layer 115 with the size smaller than the single crystal semiconductor substrate 110 is bonded to the base substrate 101. Further, a projection is formed in the periphery of the single crystal semiconductor substrate 117, and over the projection, the insulating film 112a, the insulating film 112b, and the bonding layer 114 which are not bonded to the base substrate 101 are left.

Figure 10A:
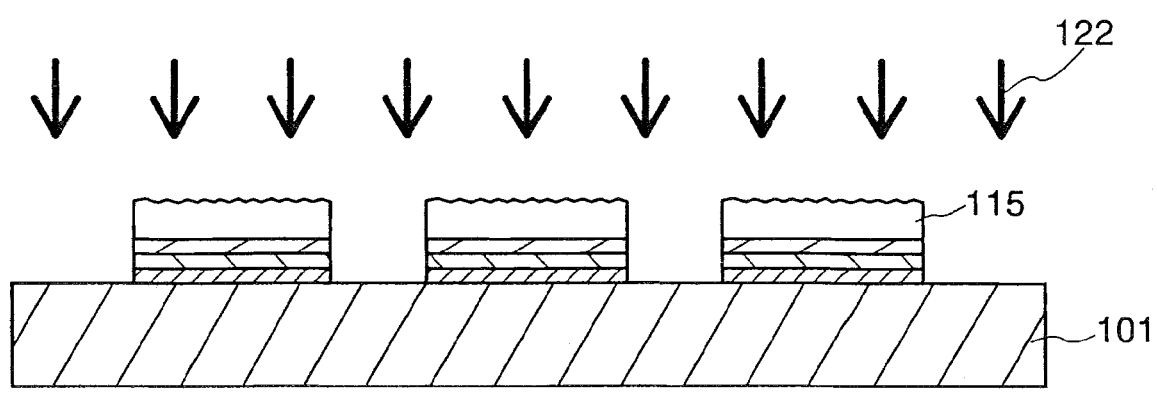
FIGS. 10A and 10B are cross-sectional views showing a method for manufacturing an SOI substrate.

In the semiconductor layer 115 disposed in close contact with the base substrate 101, a crystal defect is formed due to ion irradiation in forming the damaged region 113 or separation in the damaged region 113. Further, planarity of the surface is reduced. In order to reduce such a crystal defect and to improve planarity, the semiconductor layers 115 are irradiated with a laser beam 122 as shown in FIG. 10A.

Figure 10B:
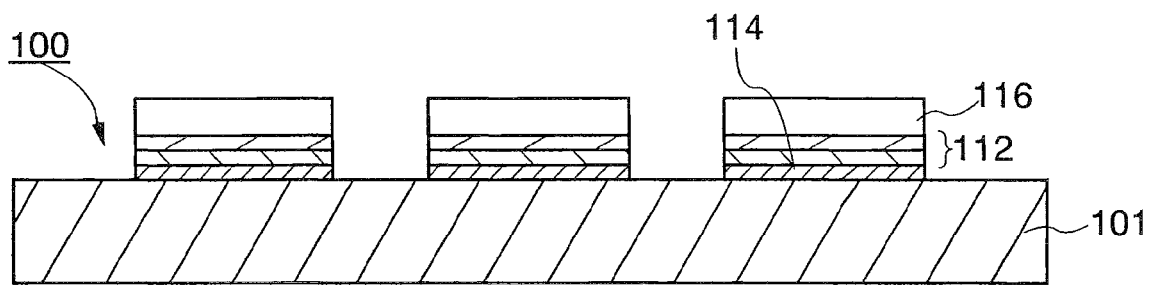

By irradiation with the laser beam 122 from the upper side of the semiconductor layers 115, the semiconductor layers 115 are melted from the upper surface. After the melting, the semiconductor layers 115 is cooled and solidified, whereby the single crystal semiconductor layers 116 in which planarity of the upper surfaces is improved as shown in FIG. 10B is formed. Note that a perspective view of FIG. 10B corresponds to FIG. 1.

In this embodiment mode, irradiation with the laser beam 122 is performed in order to improve planarity. Thus, an increase in a temperature of the base substrate 101 can be suppressed as compared to the case of planarization by heat treatment. That is, a substrate with low resistance against heat, such as a glass substrate, can be used as the base substrate 101. Note that melting of the semiconductor layer 115 by irradiation with the laser beam 122 is preferably partial melting. If the semiconductor layer 115 is completely melted, the semiconductor layer 115 is recrystallized due to disordered nucleation in the semiconductor layer 115 in a liquid phase, whereby crystallinity of the semiconductor layer 115 is lowered. By partial melting, crystal is grown from a solid phase portion which is not melted. Accordingly, defects of the semiconductor layer 115 are reduced and crystallinity is recovered. Note that "complete melting" means that the semiconductor layer 115 is melted to an interface with the bonding layer 114 and becomes a liquid state. On the other hand, "partial melting" means that an upper layer is melted and becomes a liquid phase but a lower layer is not melted and remains in a solid phase.

As a laser which oscillates the laser beam 122, a laser having an oscillation wavelength from an ultraviolet light region to a visible light region is selected. A wavelength of the laser beam 122 is needed to be a wavelength which is absorbed into the semiconductor layer 115. The wavelength can be determined in consideration of the skin depth of the laser beam and the like. For example, the wavelength can be in the range of greater than or equal to 250 nm and less than or equal to 700 nm.

As the above-described laser, a continuous wave laser, a quasi-continuous wave laser, or a pulsed laser can be used. It is preferable to use a pulsed laser for partial melting. For example, in the case of a pulsed laser, a repetition rate is less than or equal to 1 MHz, and a pulse width is greater than or equal to 10 nanoseconds and less than or equal to 500 nanoseconds. For example, a XeCl excimer laser with a repetition rate of 10 Hz to 300 Hz, a pulse width of 25 nanoseconds, and a wavelength of 308 nm can be used.

Further, the energy of the laser beam 122 can be determined in consideration of the wavelength of the laser beam 122, the skin depth of the laser beam, the thickness of the semiconductor layer 115, or the like. The irradiation energy density of the laser beam 122 can be, for example, in the range of approximately greater than or equal to 300 $mJ/cm^2$ and less than or equal to 800 $mJ/cm^2$. For example, in the case where the thickness of the semiconductor layer 115 is approximately 120 nm; a pulsed laser is used for a laser; and the wavelength of the laser beam 122 is 308 nm, the irradiation energy density of the laser beam 122 can be approximately greater than or equal to 600 $mJ/cm^2$ and less than or equal to 700 $mJ/cm^2$.

Irradiation with the laser beam 122 is preferably performed in an inert atmosphere such as a rare gas atmosphere or a nitrogen atmosphere, or in a vacuum state (a reduced-pressure state). To perform irradiation with the laser beam 122 in an inert atmosphere, an atmosphere in a chamber with an airtight structure may be controlled, and irradiation with the laser beam 122 may be performed in the chamber. In the case of using no chamber, for example, an inert gas such as a nitrogen gas is sprayed on a surface to be irradiated with the laser beam 122, whereby irradiation with the laser beam 122 in an inert atmosphere can be realized. An inert atmosphere or a vacuum state is more effective in improving planarity than an atmospheric atmosphere. In addition, the inert atmosphere or the vacuum state is more effective in suppressing generation of cracks and ridges than the atmospheric atmosphere; therefore, these atmospheres are preferable.

As the laser beam 122, a laser beam of which energy distribution is made uniform using an optical system and of which a cross-sectional shape is made linear, is preferably used. Thus, irradiation with the laser beam 122 can be performed with high throughput, and irradiation with the laser beam 122 can be performed uniformly. The beam length of the laser beam 122 is made longer than a side of the base substrate 101, whereby all the semiconductor layers 115 which are bonded to the base substrate 101 can be irradiated with the laser beam 122 by one-time scanning. In the case where the beam length of the laser beam 122 is shorter than a side of the base substrate 101, a beam length such that all the semiconductor layers 115 which are bonded to the base substrate 101 can be irradiated with the laser beam 122 by plural-time scanning may be selected.

Note that before the semiconductor layers 115 are irradiated with the laser beam 122, treatment in which an oxide film such as a natural oxide film formed over a surface of the semiconductor layer 115 is removed, is performed. The oxide film is removed because an effect of planarization can not be sufficiently obtained even if irradiation with the laser beam 122 is performed with the oxide film left over the surface of the semiconductor layer 115. Treatment of removing the oxide film can be performed using hydrofluoric acid. Treatment using hydrofluoric acid is desirably performed to the extent that the surface of the semiconductor layer 115 exhibits water repellency because removal of the oxide film from the semiconductor layer 115 can be confirmed from the semiconductor layer 115 which is made to exhibit water repellency.

A process for irradiation with the laser beam 122 shown in FIG. 10A can be carried out in the following manner. First, the semiconductor layer 115 is treated with hydrofluoric acid which is diluted to have a concentration of a hundredth (diluted with a 100-fold dilution factor) for 110 seconds, whereby the oxide film over the surface of the semiconductor layer 115 is removed. As a laser of the laser beam 122, a XeCl excimer laser (wavelength: 308 nm, pulse width: 25 nanoseconds, and repetition rate: 60 Hz) is used. With the optical system, shaping is performed so that the cross section of the laser beam 122 is made into a linear shape of 300 mm×0.34 mm. The semiconductor layer 115 is irradiated with the laser beam 122 in such a manner that the scanning rate of the laser beam 122 is set to 2.0 mm/second, the scanning pitch is set to 33 μm, and the number of beam shots is set to approximately 10 shots. The laser beam 122 is moved with a nitrogen gas sprayed on the irradiated surface. In the case where the base substrate 101 has a size of 730 mm×920 mm, the laser beam 122 is moved three times, whereby all the semiconductor layers 115 which are bonded to the base substrate 101 can be irradiated with the laser beam 122.

After the irradiation with the laser beam 122, heat treatment at a temperature of greater than or equal to 500° C. and less than or equal to 650° C. is preferably performed on the single crystal semiconductor layers 116. By the heat treatment, defects of the single crystal semiconductor layers 116 which are not recovered by irradiation with the laser beam 122 can be eliminated, and distortion of the single crystal semiconductor layer 116 can be relieved. For the heat treatment, a rapid thermal anneal (RTA) apparatus, a resistant-heating furnace, a microwave heating apparatus, or the like can be used. In the case of using, for example, a resistant-heating furnace, heating may be performed at 500° C. for one hour, then, heating may be performed at 550° C. for four hours.

Through the above-described processes, the semiconductor substrate 100 shown in both FIG. 1 and FIG. 10B can be manufactured. According to this embodiment mode, the insulating layers 112, the damaged regions 113, and the bonding layers 114 can be collectively provided for the plurality of single crystal semiconductor substrates 110 arranged in the tray 10. Thus, the semiconductor substrate 100 can be formed with high throughput. Further, since the single crystal semiconductor substrates 110 are bonded to the base substrate 101 while being arranged in the tray 10, the plurality of single crystal semiconductor substrates 110 can be easily bonded to the base substrate 101 with high throughput.

Note that the single crystal semiconductor substrates 110 are not transferred to another tray 10 in the processes shown in FIGS. 7A to 7C; however, in each process, the single crystal semiconductor substrates 110 may be transferred to a tray 10 dedicated to an apparatus used in the process. For example, a tray 10 dedicated to a PECVD apparatus can be used in the process of forming the insulating layer 112 of FIG. 7A, and a tray 10 dedicated to a doping apparatus can be used in the process of FIG. 7C.

Further, after the process for forming the insulating layer 112 of FIG. 7A, the single crystal semiconductor substrates 110 provided with the insulating layers 112 can be taken out from the tray 10, cleaning treatment such as an ultrasonic cleaning can be performed on the single crystal semiconductor substrates 110, and the single crystal semiconductor substrates 110 can be arranged in another tray 10 which is clean.

Furthermore, after the process for forming the damaged regions 113 of FIG. 7B, the single crystal semiconductor substrates 110 provided with the damaged regions 113 can be taken out from the tray 10, cleaning treatment such as an ultrasonic cleaning can be performed on the single crystal semiconductor substrates 110, and the single crystal semiconductor substrates 110 can be arranged in another tray 10 which is clean.

(Embodiment Mode 2)

This embodiment mode describes reprocessing of a single crystal semiconductor substrate. In specific, the case where the single crystal semiconductor substrates 117 shown in FIG. 8B is reprocessed is described with reference to FIGS. 11A to 11D.

After the process of FIG. 8B, a projection 117a is formed in the periphery of the single crystal semiconductor substrate 117 as shown in FIGS. 11A to 11D, and an insulating film 112a, an insulating film 112b, and a bonding layer 114 are left over the projection 117a.

Figure 11A:
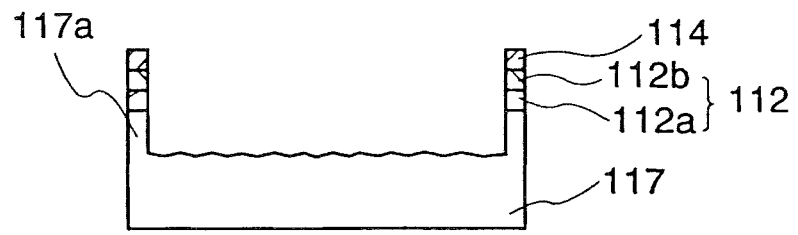
FIGS. 11A to 11D are diagrams showing reprocessing of a single crystal semiconductor substrate.
Figure 11B:
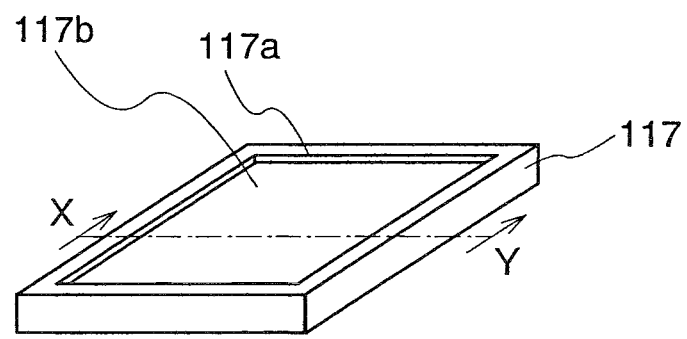
Figure 11C:
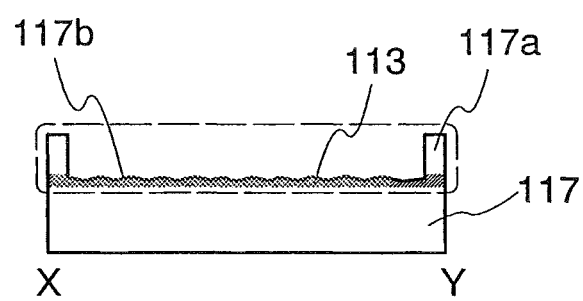

First, etching treatment by which the insulating film 112a, the insulating film 112b, and the bonding layer 114 are removed is performed. When these films and the layer are formed from silicon oxide, silicon oxynitride, or silicon nitride oxide, wet etching treatment using hydrofluoric acid may be performed, for example. By the etching treatment, a single crystal semiconductor substrate 117 as shown in FIG. 11B is obtained. FIG. 11C is a cross-sectional view taken along a long dashed short dashed line X-Y of FIG. 11B.

Next, the single crystal semiconductor substrate 117 shown in FIGS. 11B and 11C is subjected to etching treatment, whereby the projection 117a and a separation surface 117b are removed. A portion surrounded by a dashed line, which is shown in FIG. 11C, is a portion to be removed by the etching treatment. By the etching, a damaged region 113 which is left in the single crystal semiconductor substrate 117 is removed. As the etching treatment which is performed on the single crystal semiconductor substrate 117, wet etching treatment is preferable. As etchant, a tetramethylammonium hydroxide (abbreviation: TMAH) solution can be used.

Figure 11D:
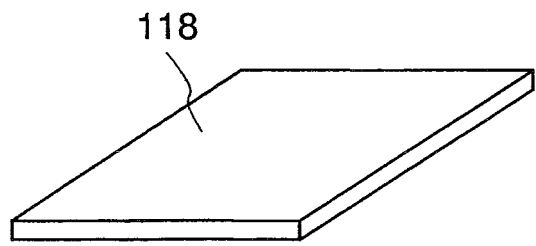

The single crystal semiconductor substrate 117 is subjected to the etching treatment, whereby the projection 117a, the separation surface 117b, and the damaged region 113 are removed. Then, a surface of the single crystal semiconductor substrate 117 is mechanically polished; thus, a single crystal semiconductor substrate 118 having a smooth surface as shown in FIG. 11D is formed. The single crystal semiconductor substrate 118 can be reused as the single crystal semiconductor substrate 110 shown in FIG. 2.

For the polishing treatment, chemical mechanical polishing (abbreviation: CMP) can be used. To smooth a surface of the single crystal semiconductor substrate 118, the surface is desirably polished by approximately greater than or equal to 1 μm and less than or equal to 10 μm in thickness. After the polishing, cleaning with hydrofluoric acid or RCA cleaning is performed because abrasive particles or the like are left over a surface of the single crystal semiconductor substrate 118.

As described in this embodiment mode, a single crystal semiconductor substrate is reused, whereby a cost for a material of a semiconductor substrate 100 can be reduced.

This embodiment mode can be used in combination with Embodiment Mode 1.

(Embodiment Mode 3)

Figure 12A:
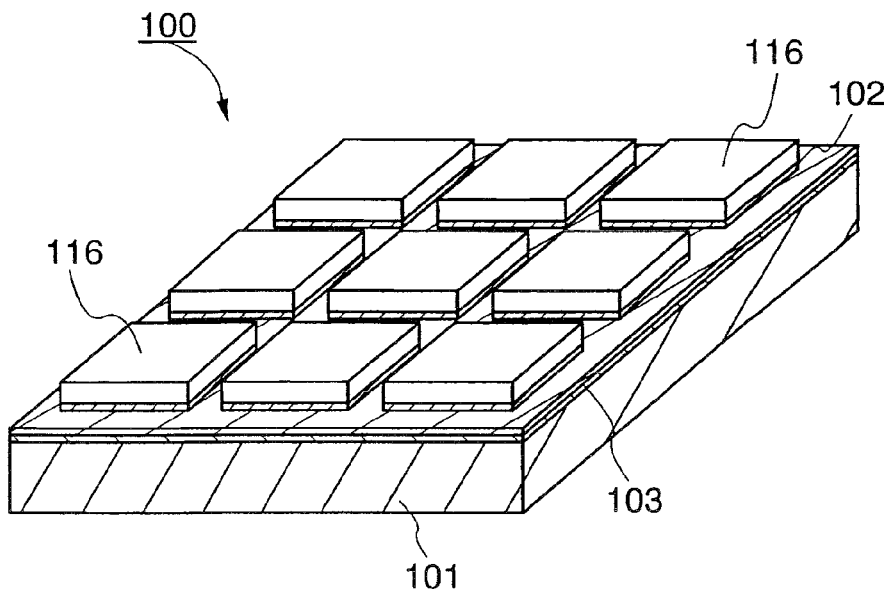
FIGS. 12A to 12C are diagrams showing an example of an SOI substrate.
Figure 12B:
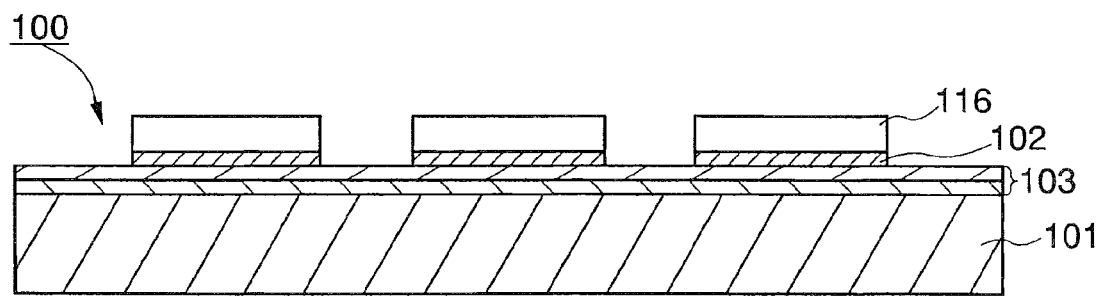
Figure 12C:
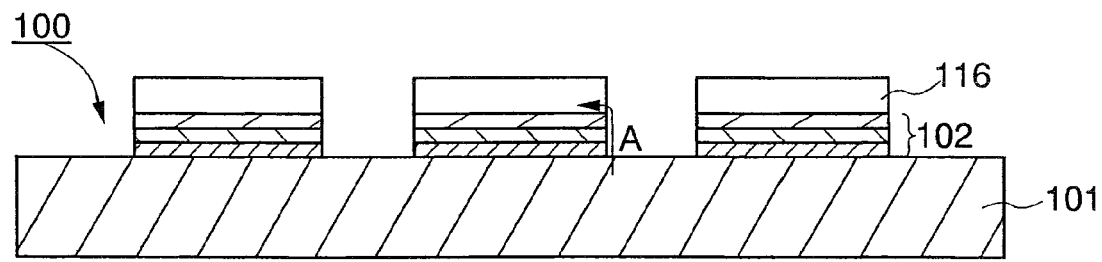

This embodiment mode describes, with reference to FIGS. 12A to 12C, the case where an insulating layer serving as a barrier layer is provided over a base substrate, as another example of a semiconductor substrate having a plurality of single crystal semiconductor layers over a substrate. Note that for most part of a method for manufacturing a semiconductor substrate of this embodiment mode, Embodiment Mode 1 can be referred to.

FIG. 12A is a perspective view showing a structural example of a semiconductor substrate 100. FIG. 12B is a cross-sectional view of FIG. 12A. The semiconductor substrate 100 has a structure in which a plurality of single crystal semiconductor layers 116 are bonded to one base substrate, which is a base substrate 101. Each of the single crystal semiconductor layers 116 is provided over the base substrate 101 with an insulating layer 102 and an insulating layer 103 interposed therebetween, and the semiconductor substrate 100 is referred to as a so-called an SOI substrate.

Here, a point which is particularly different from the structure described in Embodiment Mode 1 is that the insulating layer 103 is formed over an entire surface of the base substrate 101. The insulating layer 103 has a function as a barrier layer. The insulating layer 103 serving as a barrier layer is provided over an entire surface of the base substrate 101 as described above, whereby a barrier layer, which is further effective as compared to the one having a structure in which an insulating layer is provided only under the single crystal semiconductor layer 116, can be formed. That is, in the case where the insulating layers are provided only under the single crystal semiconductor layers 116 (see FIG. 12C), a route of penetration of an impurity element (for example, a route like a route A) is present in a region where the single crystal semiconductor layers 116 is not provided; however, by providing an insulating layer so as to completely cover the base substrate 101, an even small route of penetration can be excluded. Accordingly, a barrier function can be further increased.

Note that a specific example of an insulating layer serving as a barrier layer is omitted here because Embodiment Mode 1 can be referred to. In this embodiment mode, the insulating layer 103 is made to have a stacked-layer structure of a silicon nitride oxide film (a lower layer) and a silicon oxynitride film (an upper layer); however, the present invention is not construed as being limited thereto. For example, a silicon oxide film can be used as the upper layer and a nitride film can be used as the lower layer. Alternatively, the insulating layer 103 can have a single-layer structure or a multilayer structure including three or more layers. In the case of forming the insulating layer 103 to have a single-layer structure, silicon nitride can be used, for example. Note that this embodiment mode describes an example in which the insulating layer 102 is formed using only a bonding layer 114; however, a structure provided with an insulating layer serving as a barrier layer, or the like, like the insulating layer 112 in Embodiment Mode 1, may be used. In this case, a barrier function can be further improved. Further, in order to keep a favorable interface with a semiconductor layer, a region of the insulating layer 112 which is in contact with the semiconductor layer may be provided with a silicon oxide film, a silicon oxynitride film, or the like.

The structure of the semiconductor substrate 100 relating to this embodiment mode is different from the structure described in Embodiment Mode 1 only in the insulating layer 102 and the insulating layer 103. Therefore, for parts other than the insulating layer 102 and the insulating layer 103, Embodiment Mode 1 may be referred to. Also for a manufacturing method, Embodiment Mode 1 can be similarly referred to.

This embodiment mode can be used in combination with Embodiment Mode 1 and 2, as appropriate.

(Embodiment Mode 4)

This embodiment mode describes, with reference to FIG. 13, FIG. 14, FIG. 15, and FIG. 16, a semiconductor substrate having a structure in which a plurality of single crystal semiconductor layers are tightly arranged without any space therebetween, as another example of a semiconductor substrate having a plurality of single crystal semiconductor layers over a substrate. Note that for most part of a method for manufacturing a semiconductor substrate of this embodiment mode, Embodiment Mode 1 can be referred to.

Figure 13:
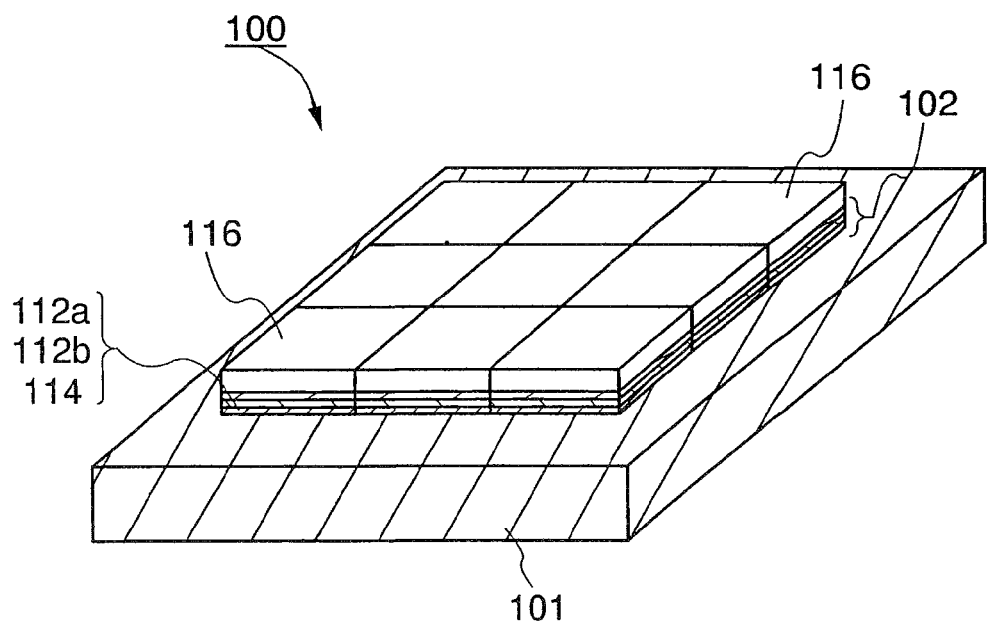
FIG. 13 is a diagram showing an example of an SOI substrate.

FIG. 13 is a perspective view showing a structural example of a semiconductor substrate 100. The semiconductor substrate 100 has a structure in which a plurality of single crystal semiconductor layers 116 are bonded to one base substrate, which is the base substrate 101. Each of the single crystal semiconductor layers 116 is provided over the base substrate 101 with an insulating layer 102 interposed therebetween, and the semiconductor substrate 100 is referred to as a so-called an SOI substrate.

Here, a point which is particularly different from the structure described in Embodiment Mode 1 is that the single crystal semiconductor layers 116 are tightly arranged over the base substrate 101 without any space therebetween. By tightly arranging the single crystal semiconductor layers 116 without any space therebetween as described above, a semiconductor device which is needed for a large area, such as a display device, can be manufactured. In specific, a distance between the adjacent single crystal semiconductor layers 116 is set to less than or equal to 0.5 mm, preferably less than or equal to 0.3 mm, whereby a structure without any substantial space can be obtained.

Note that in order to manufacture a semiconductor substrate described in this embodiment mode, a property of a single crystal semiconductor substrate, such as planarity or accuracy of cutting of a single crystal semiconductor substrate to be used, is significantly important. As described in Embodiment Mode 1, a peripheral portion of a single crystal semiconductor substrate is not sufficiently bonded in the case where the peripheral portion has a curvature, the case where the peripheral portion has insufficient planarity, the case where the peripheral portion has flaw or dirt, or the like. Therefore, these points are needed to be noted.

Figure 14:
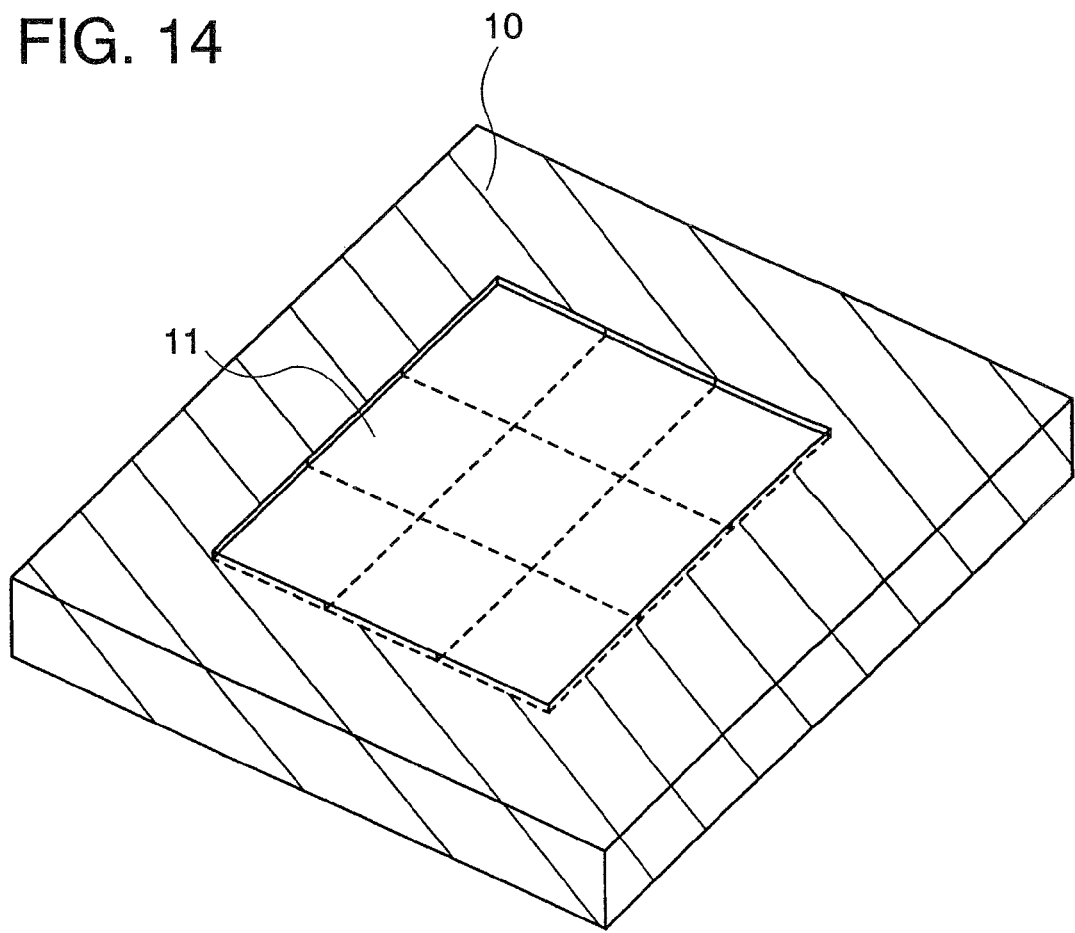
FIG. 14 is a diagram showing an example of a tray.
Figure 15:
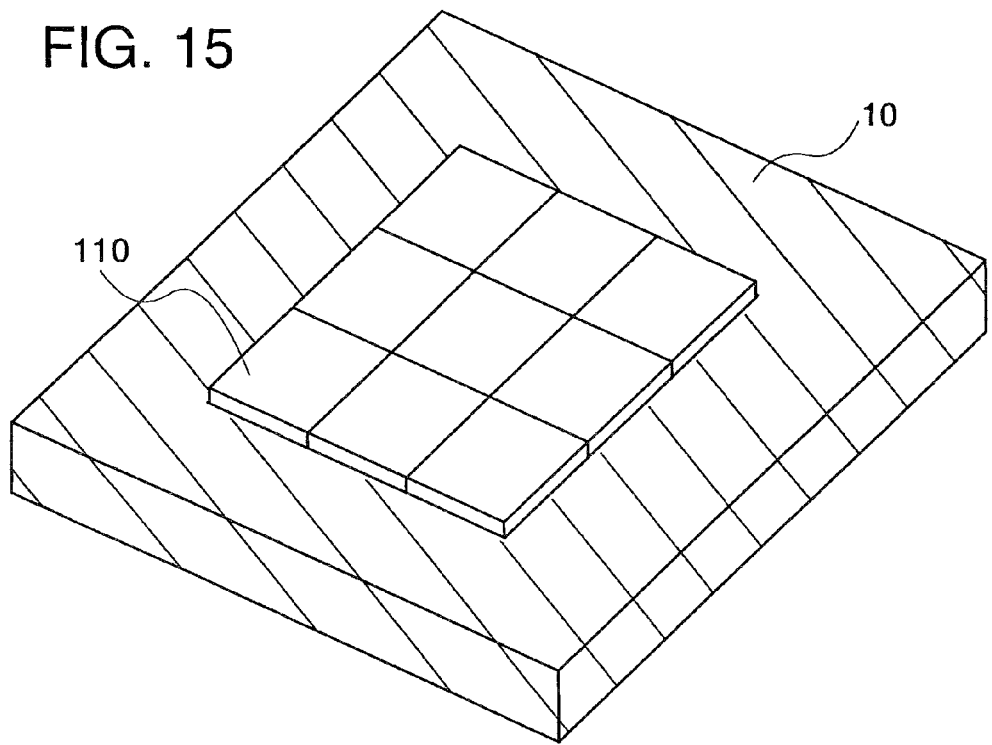
FIG. 15 is a diagram showing a state where single crystal semiconductor substrates are arranged in a tray.
Figure 16:
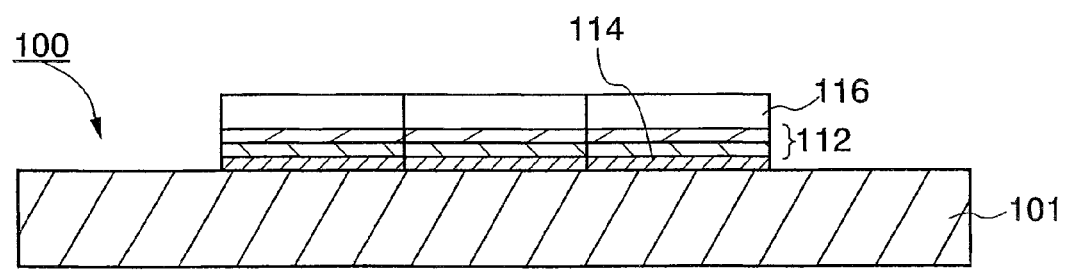
FIG. 16 is a cross-sectional view showing an example of an SOI substrate.

FIG. 14 shows an example of a structure of a tray 10 to be used in this embodiment mode. The tray 10 is made of a plate member, in which a depression 11 for holding the single crystal semiconductor substrates 110 is provided. As described above, the depression 11 is made to have a shape which enables a plurality of single crystal semiconductor substrates 110 to be tightly arranged without any space therebetween; thus, the semiconductor substrate 100 having a structure in which the single crystal semiconductor layers 116 are tightly arranged without any space therebetween can be manufactured. Note that here, the depression 11 in the case where one block has the single crystal semiconductor substrates 110 arranged in three rows and three columns is shown; however, the present invention is not construed as being limited to the structure. For example, the number of rows and columns may be changed as appropriate. As shown in FIG. 15, with the use of the tray 10, a plurality of single crystal semiconductor substrates 110 are arranged in the depression 11 of the tray 10, and each process is undergone, whereby the semiconductor substrate 100 shown in FIG. 13 is completed. Note that FIG. 16 corresponds to a cross-sectional view of FIG. 13. For the description on the quality, the size, or the like of the tray 10 is omitted here because Embodiment Mode 1 can be referred to.

The structure of the semiconductor substrate 100 relating to this embodiment mode is different from the structure described in Embodiment Mode 1 only in that a plurality of single crystal semiconductor layers are tightly arranged without any space therebetween. Therefore, for other parts of the structure, Embodiment Mode 1 can be referred to.

This embodiment mode can be used in combination with Embodiment Modes 1 to 3, as appropriate.

(Embodiment Mode 5)

This embodiment mode describes a method for manufacturing a thin film transistor as an example of a method for manufacturing a semiconductor device using a semiconductor substrate 100. By combining a plurality of thin film transistors, various semiconductor devices are formed. In this embodiment mode, the semiconductor substrate 100 manufactured by the manufacturing method of Embodiment Mode 1 is used.

Figure 17A:
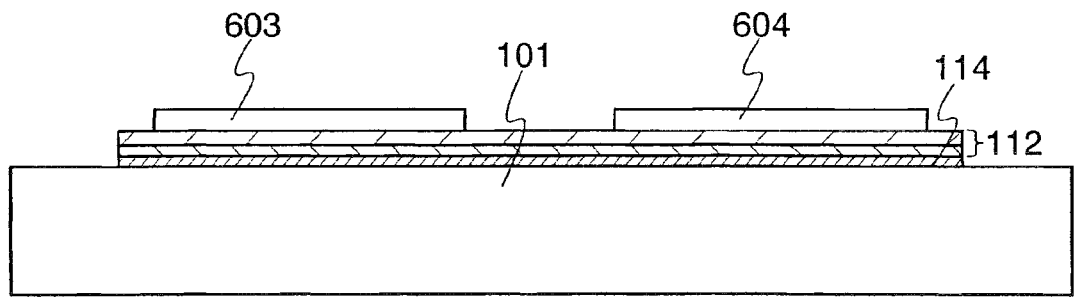
FIGS. 17A to 17D are cross-sectional views showing a method for manufacturing a semiconductor device.

First, as shown in FIG. 17A, a single crystal semiconductor layer 116 over the base substrate 101 is processed (patterned) into a desired shape by etching; thus, a semiconductor film 603 and a semiconductor film 604 are formed.

To the semiconductor films 603 and 604, a p-type impurity such as boron, aluminum, or gallium, or an n-type impurity such as phosphorus or arsenic may be added in order to control a threshold voltage. For example, in the case of adding boron as an impurity imparting p-type conductivity, boron may be added at a concentration of $5\times10^{16}$ cm$^{-3}$ to $1\times10^{17}$ cm$^{-3}$ inclusive. The addition of an impurity for controlling a threshold voltage may be performed on the single crystal semiconductor layer 116 or may be performed on the semiconductor films 603 and 604. The addition of an impurity for controlling a threshold voltage may be performed on a single crystal semiconductor substrate 110. Alternatively, the addition of an impurity may be performed on the single crystal semiconductor substrate 110 in order to roughly control a threshold voltage, and the addition of an impurity may be further performed on the single crystal semiconductor layer 116 or the semiconductor films 603 and 604 in order to finely control a threshold voltage.

Moreover, hydrogenation treatment may be performed after forming the semiconductor films 603 and 604 and before forming gate insulating films 606. The hydrogenation is performed, for example, at 350° C. in a hydrogen atmosphere for about 2 hours.

Figure 17B:
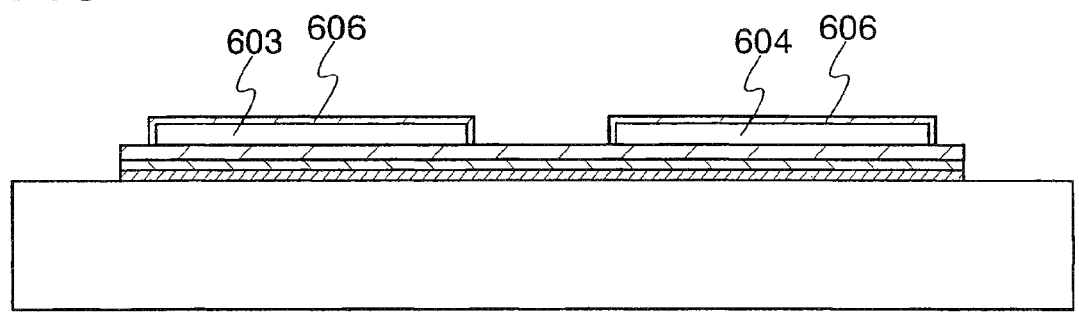

Next, as shown in FIG. 17B, the gate insulating films 606 are formed to cover the semiconductor films 603 and 604. Surfaces of the semiconductor films 603 and 604 may be oxidized or nitrided by high-density plasma treatment, whereby the gate insulating films 606 can be formed. High-density plasma treatment is performed by using, for example, a mixed gas of a rare gas such as He, Ar, Kr, or Xe, and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are produced by such high-density plasma, whereby each insulating films is formed to a thickness of greater than or equal to 1 nm and less than or equal to 20 nm, desirably greater than or equal to 5 nm and less than or equal to 10 nm so as to be in contact with the semiconductor films. The insulating films are used as the gate insulating films 606.

Since the oxidation or nitridation of the semiconductor films by the high-density plasma treatment proceeds by a solid-phase reaction, the interface state density between the gate insulating film 606 and each of the island-shaped semiconductor films 603 and 604 can be drastically decreased. Further, the semiconductor films are directly oxidized or nitrided by the high-density plasma treatment, whereby variation in thickness of the insulating films to be formed can be suppressed. Since the semiconductor films have crystallinity, even when surfaces of the semiconductor films are oxidized by a solid-phase reaction by using the high-density plasma treatment, nonuniform oxidation in a crystal grain boundary can be prevented; thus, a gate insulating film with good uniformity and low interface state density can be formed. When a transistor is formed in such a manner that a gate insulating film is partially or entirely included in the insulating film formed by high-density plasma treatment as described above, variation in characteristic of transistors can be suppressed.

Alternatively, the gate insulating films 606 may be formed by thermally oxidizing the semiconductor films 603 and 604. In the case of forming the gate insulating films 606 by such thermal oxidation, a base substrate with a comparatively high heat resistance is preferably used.

Further alternatively, the gate insulating film 606 may be formed as a single layer or a stack of a film including silicon oxide, silicon nitride oxide, silicon nitride, hafnium oxide, aluminum oxide, or tantalum oxide by a plasma CVD method, a sputtering method, or the like.

Still further alternatively, hydrogen included in the gate insulating film 606 may be dispersed in the semiconductor films 603 and 604 by performing heat treatment at a temperature of greater than or equal to 350° C. and less than or equal to 450° C. after the gate insulating film 606 including hydrogen is formed. In this case, the gate insulating film 606 may be formed by depositing silicon nitride or silicon nitride oxide by a plasma CVD method. Further, in this case, a process temperature is set to less than or equal to 350° C. In this manner, hydrogen is supplied to the semiconductor films 603 and 604, whereby defects in the semiconductor films 603 and 604, at an interface between the gate insulating film 606 and the semiconductor film 603, and at an interface between the gate insulating film 606 and the semiconductor film 604 can be effectively reduced.

Figure 17C:
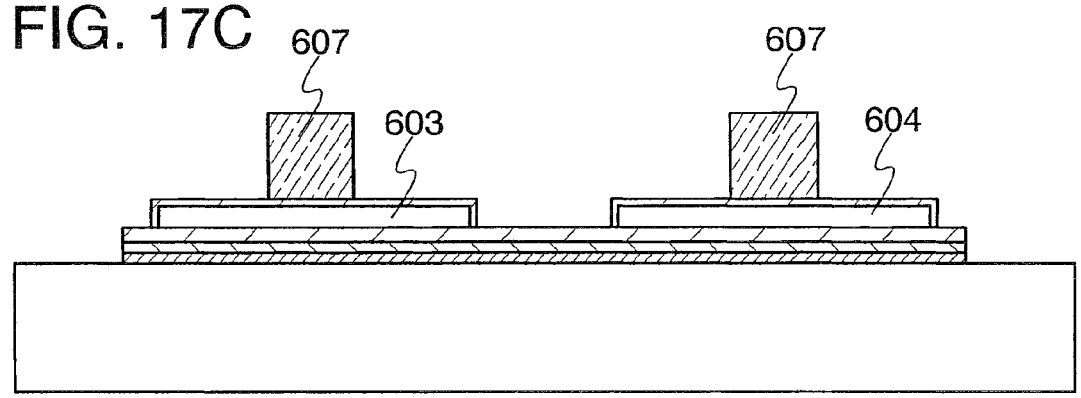

Next, as shown in FIG. 17C, a conductive film is formed over the gate insulating films 606, and then the conductive film is processed (patterned) into a predetermined shape, whereby electrodes 607 are formed over the semiconductor films 603 and 604. The conductive film can be formed by a CVD method, a sputtering method, or the like. The conductive film can be formed from a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material such as polycrystalline silicon, which is obtained by doping a semiconductor film with an impurity element that imparts conductivity, or the like may be used.

Although each of the electrodes 607 is formed of a single-layer conductive film in this embodiment mode, this embodiment mode is not limited to the structure. Each of the electrodes 607 may be formed of plural conductive films which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that as masks used for forming the electrodes 607, silicon oxide, silicon nitride oxide, or the like may be used instead of a resist material. In this case, a process for forming a mask by patterning a silicon oxide film, a silicon oxynitride film, or the like is additionally needed; however, the amount of the reduced film thickness of the mask in etching is smaller than the resist material; thus, the electrode 607 with an accurate shape can be formed. Alternatively, the electrodes 607 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrode 607 can be formed by etching the conductive film to have a desired tapered shape by an inductively coupled plasma (ICP) etching method with appropriate regulation of the etching conditions (e.g., the amount of electric energy applied to a coiled electrode layer, the amount of electric energy applied to an electrode layer on the substrate side, and the electrode temperature on the substrate side). The tapered shape can be adjusted according to the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 17D:
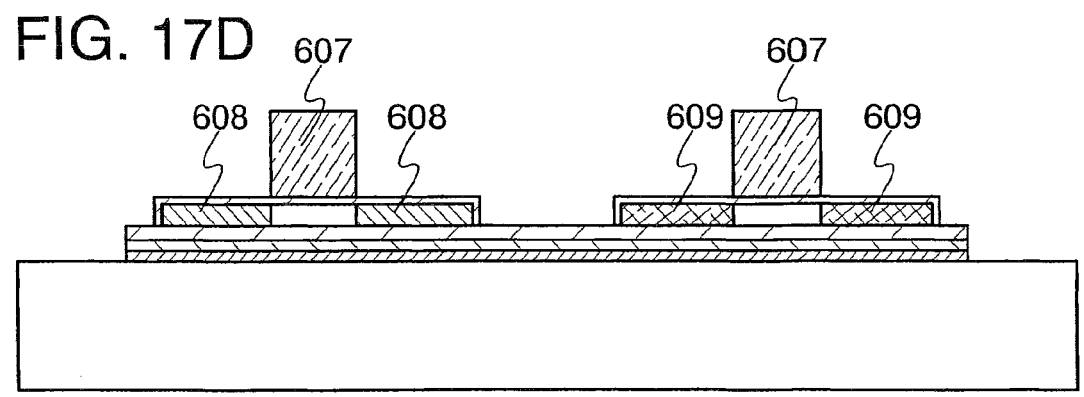

Next, as shown in FIG. 17D, an impurity element imparting one conductivity type is added to the semiconductor films 603 and 604 with the electrodes 607 used as masks. In this embodiment mode, an impurity element imparting n-type conductivity (for example, phosphorus or arsenic) is added to the semiconductor film 603, and an impurity element imparting p-type conductivity (for example, boron) is added to the semiconductor film 604. Note that when the impurity element imparting n-type conductivity is added to the semiconductor film 603, the semiconductor film 604 to which the p-type impurity element is added is covered with a mask or the like so that the impurity element imparting n-type conductivity is added selectively. Further, when the impurity element imparting p-type conductivity is added to the semiconductor film 604, the semiconductor film 603 to which the n-type impurity element is added is covered with a mask or the like so that the impurity element imparting p-type conductivity is added selectively. Alternatively, after an impurity element imparting one of p-type and n-type conductivities is added to the semiconductor films 603 and 604, an impurity element imparting the other conductivity may be added to only one of the semiconductor films so as to form a higher concentration region. By the addition of the impurity, impurity regions 608 are formed in the semiconductor film 603 and impurity regions 609 are formed in the semiconductor film 604.

Figure 18A:
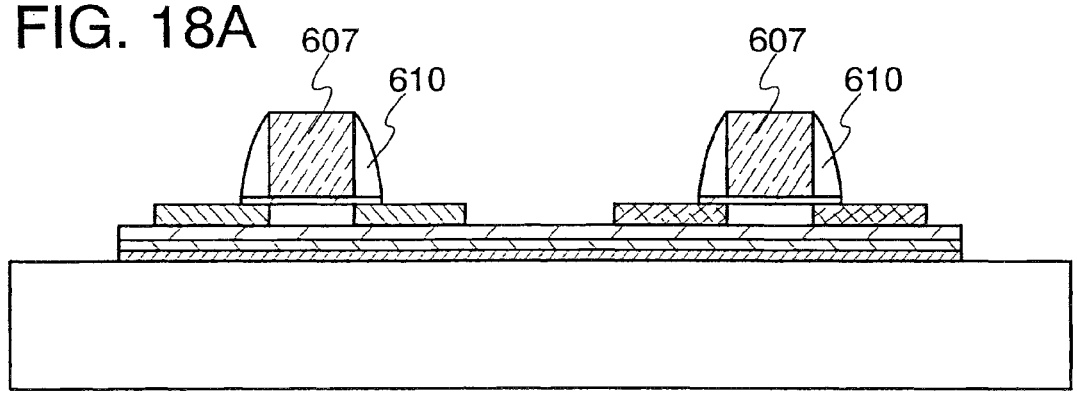
FIGS. 18A to 18C are cross-sectional views showing a method for manufacturing a semiconductor device.

Subsequently, as shown in FIG. 18A, sidewalls 610 are formed on side surfaces of the electrodes 607. The sidewalls 610 can be formed by, for example, newly forming an insulating film so as to cover the gate insulating film 606 and the electrodes 607 and by partially etching the newly-formed insulating film by anisotropic etching mainly in a perpendicular direction. The newly-formed insulating film is partially etched by the above-described anisotropic etching, whereby the sidewalls 610 are formed on the side surfaces of the electrodes 607. Note that the gate insulating films 606 may also be etched partially by the above-described anisotropic etching. For the insulating film for forming the sidewalls 610, a silicon film, a silicon oxide film, or a silicon nitride oxide film; or a film containing an organic material such as an organic resin may be formed to have a single layer structure or a stacked-layer structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the process for forming the sidewalls 610 is not limited to these steps.

Figure 18B:
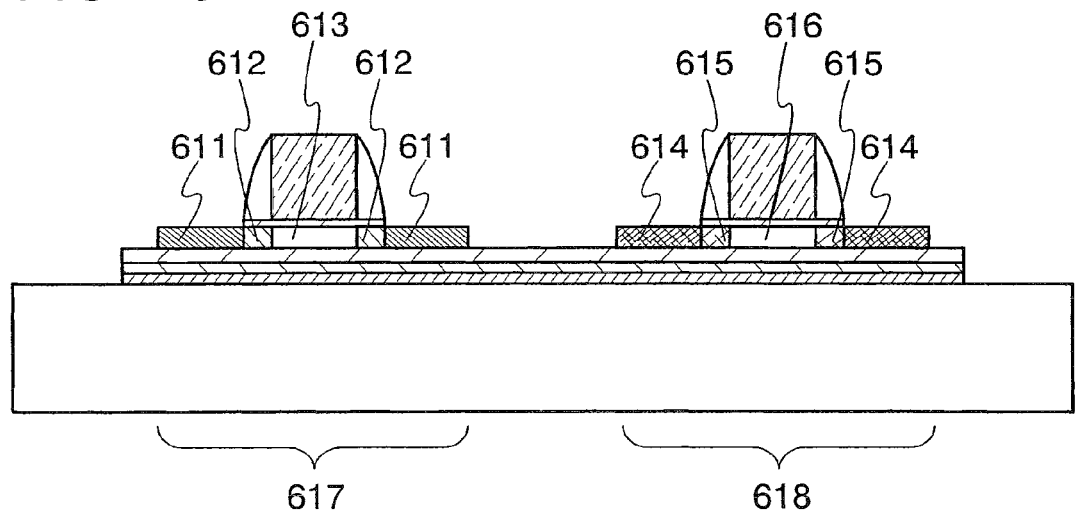

Next, as shown in FIG. 18B, an impurity element imparting one conductivity type is added to the semiconductor films 603 and 604 with the electrodes 607 and the sidewalls 610 used as masks. Note that the impurity element imparting the same conductivity type as the impurity element which has been added to the semiconductor films 603 and 604 in the previous process are added to the semiconductor films 603 and 604 to form a higher concentration region. Note that when the impurity element imparting n-type conductivity is added to the semiconductor film 603, the semiconductor film 604 to which the p-type impurity element is added is covered with a mask or the like so that the impurity element imparting n-type conductivity is added selectively. Alternatively, when the impurity element imparting p-type conductivity is added to the semiconductor film 604, the semiconductor film 603 to which the n-type impurity element is added is covered with a mask or the like so that the impurity element imparting p-type conductivity is added selectively.

By the above-described addition of the impurity element, a pair of high-concentration impurity regions 611, a pair of low-concentration impurity regions 612, and a channel formation region 613 are formed in the semiconductor film 603. In addition, by the above-described addition of the impurity element, a pair of high-concentration impurity regions 614, a pair of low-concentration impurity regions 615, and a channel formation region 616 are formed in the semiconductor film 604. The high-concentration impurity regions 611 and 614 function as sources and drains, and the low-concentration impurity regions 612 and 615 function as LDD (lightly doped drain) regions.

Note that the sidewalls 610 formed over the semiconductor film 604 and the sidewalls 610 formed over the semiconductor film 603 may be formed so as to have the same width in the carrier flow direction (that is, a direction parallel to a channel length), or may be formed so as to have different widths. It is preferable that the width of each sidewall 610 over the semiconductor film 604 which constitutes a part of a p-channel transistor be larger than the width of each sidewall 610 over the semiconductor film 603 which constitutes a part of an n-channel transistor. This is because boron which is added for forming a source and a drain in the p-type transistor is easily diffused and a short channel effect is easily induced. By increasing the widths of the sidewalls 610 of the p-type transistor, boron can be added to the source and the drain to form a high concentration region, whereby the source and the drain can be made to have a lower resistance.

A silicide layer in which silicide is formed in the semiconductor films 603 and 604 may be formed in order to further reduce the resistance of the source and the drain. The silicide is formed by placing a metal in contact with the semiconductor films and causing a reaction between the metal and silicon in the semiconductor films by heat treatment (for example, a GRTA method, an LRTA method, or the like). The silicide layer may be formed from cobalt silicide or nickel silicide. In the case where the semiconductor films 603 and 604 are thin, silicide reaction may proceed to bottoms of the semiconductor films 603 and 604. As a metal material used for forming silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can be formed by laser beam irradiation or the like.

Through the aforementioned processes, an n-channel transistor 617 and a p-channel transistor 618 are formed. Note that although conductive films serving as source electrodes or drain electrodes are not formed in a stage shown in FIG. 18B, a structure including these conductive films may be referred to as a transistor.

Figure 18C:
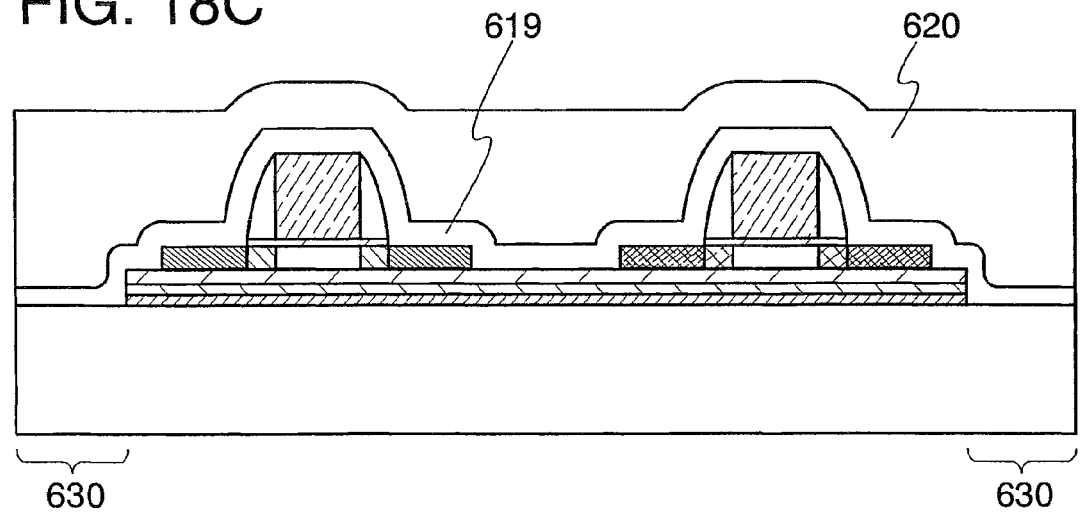

Next, as shown in FIG. 18C, an insulating film 619 is formed to cover the n-channel transistor 617 and the p-channel transistor 618. The insulating film 619 is not always necessary; however, the formation of the insulating film 619 can prevent impurities such as an alkali metal and an alkaline earth metal from penetrating the n-channel transistor 617 and the p-channel transistor 618. In specific, the insulating film 619 is desirably formed from a material such as silicon nitride, silicon nitride oxide, aluminum nitride, aluminum oxide, silicon oxide, or the like. In this embodiment mode, the insulating film 619 is formed of a silicon nitride oxide film with a thickness of about 600 nm. In this case, the above-described hydrogenation process may be performed after the silicon nitride oxide film is formed. Note that although the insulating film 619 is formed to have a single-layer structure in this embodiment mode, it is needless to say that the insulating film 619 may have a stacked-layer structure. For example, in the case of a two-layer structure, the insulating film 619 may have a stacked-layer structure of a silicon oxynitride film and a silicon nitride oxide film.

Owing to the insulating film 619, an insulating layer serving as a barrier layer is also provided over a region 630 where the single crystal semiconductor layer 116 is not formed. Accordingly, a region where the base substrate 101 is exposed can be precluded. Thus, an impurity element from the base substrate 101 can be prevented from being diffused in the semiconductor layer or the like. That is, deterioration of a semiconductor device can be reduced, and a highly reliable semiconductor device can be provided.

Next, an insulating film 620 is formed over the insulating film 619 so as to cover the n-channel transistor 617 and the p-channel transistor 618. The insulating film 620 may be formed from an organic material having heat resistance, such as polyimide, acrylic, benzocyclobutene, polyamide, or epoxy. As an alternative to the organic materials listed above, a low-dielectric constant material (a low-k material), a siloxane-based resin, silicon oxide, silicon nitride, silicon nitride oxide, PSG (phosphosilicate glass), BPSG (borophosphosilicate glass), alumina, or the like may be used. As a substituent, the siloxane-based resin may include at least any one of hydrogen, fluorine, an alkyl group, and aromatic hydrocarbon as a substituent. Alternatively, the insulating film 620 may be formed by stacking plural insulating films formed of any of these materials. The insulating film 620 may be planarized by a CMP method or the like.

Note that the siloxane-based resin corresponds to a resin including a Si—O—Si bond which is formed using a siloxane-based material as a starting material. The siloxane-based resin may have at least one of fluorine, an alkyl group, and aromatic hydrocarbon besides hydrogen as a substituent.

For the formation of the insulating film 620, the following method can be used depending on the material of the insulating film 620: a CVD method, a sputtering method, an SOG method, a spin coating method, a dip coating method, a spray coating method, a droplet discharge method (e.g., an ink-jet method, screen printing, or offset printing), a doctor knife, a roll coater, a curtain coater, a knife coater, or the like.

Figure 19:
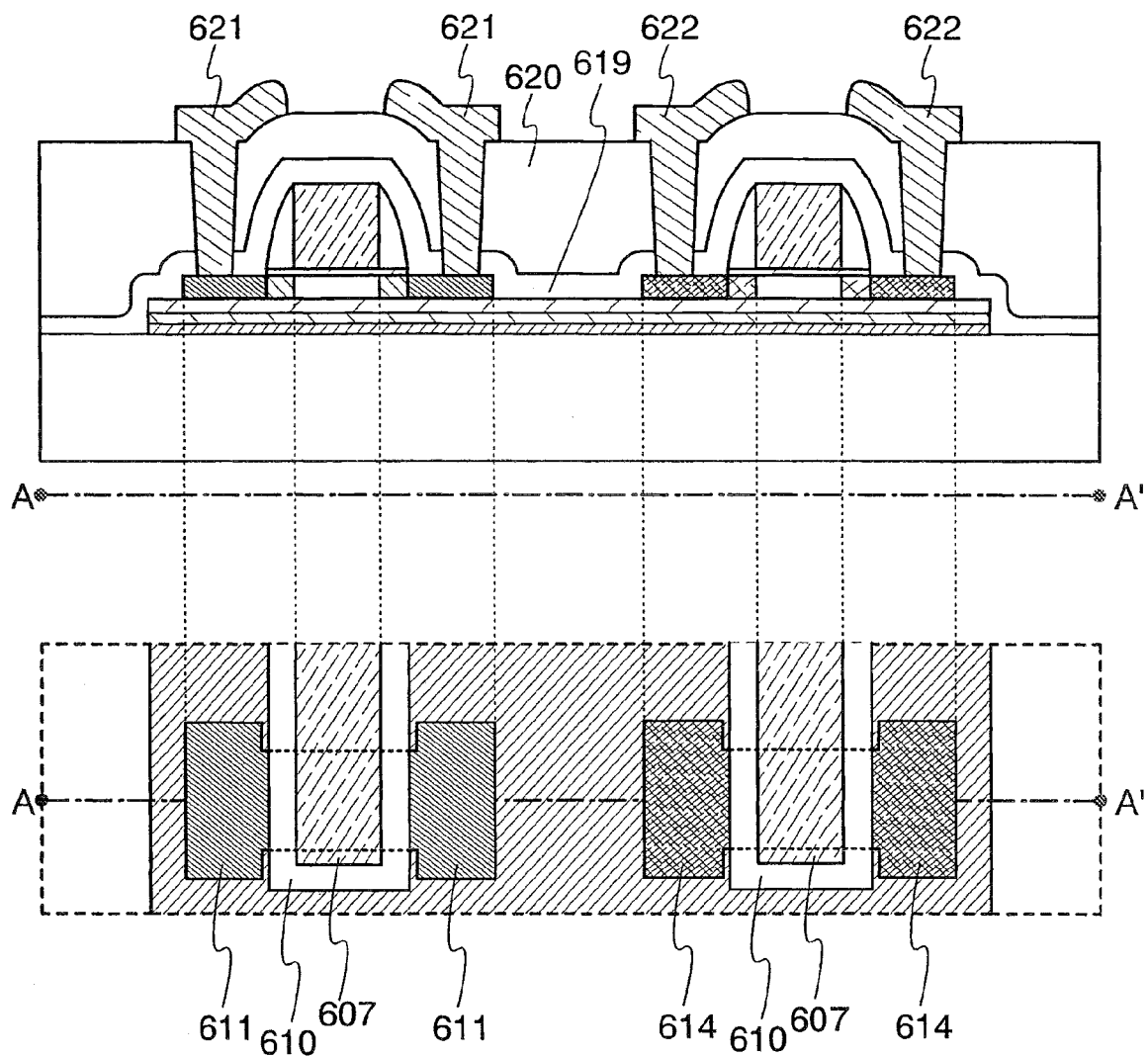
FIG. 19 is a cross-sectional view and a top view which show an example of a semiconductor device.

Next, as shown in FIG. 19, contact holes are formed in the insulating films 619 and 620 so that each of the semiconductor films 603 and 604 is partially exposed. Then, conductive films 621 and 622 are formed to be in contact with the semiconductor films 603 and 604, respectively, through the contact holes. The conductive films 621 and 622 serve as source or drain electrodes of the transistors. Note that in this embodiment mode, as an etching gas for forming the contact holes, a mixed gas of $CHF_3$ and He is employed; however, the etching gas is not limited thereto.

The conductive films 621 and 622 can be formed by a CVD method, a sputtering method, or the like. In specific, the conductive films 621 and 622 can be formed from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described metal as the main component or a compound containing the above-described metal may be used. The conductive films 621 and 622 may each have a single-layer structure or a stacked-layer structure.

As an example of an alloy containing aluminum as its main component, an alloy containing aluminum as its main component and also containing nickel is given. In addition, an alloy containing aluminum as its main component and also containing nickel and one or both of carbon and silicon can also be given as an example thereof. Since aluminum and aluminum silicon have low resistance and are inexpensive, aluminum and aluminum silicon are suitable as a material for forming the conductive films 621 and 622. In particular, the aluminum silicon (Al—Si) film is preferable because a hillock can be prevented from generating in resist baking at the time of patterning. Cu may be mixed into an aluminum film by approximately 0.5% instead of silicon (Si).

In the case where each of the conductive films 621 and 622 is formed to have a stacked-layer structure, a stacked-layer structure of a barrier film, an aluminum silicon (Al—Si) film, and a barrier film; a stacked-layer structure of a barrier film, an aluminum silicon (Al—Si) film, a titanium nitride film, and a barrier film; or the like may be used, for example. Note that the barrier film refers to a film formed using titanium, a nitride of titanium, molybdenum, or a nitride of molybdenum. By forming barrier films so as to interpose an aluminum silicon (Al—Si) film therebetween, generation of a hillock of aluminum or aluminum silicon can be further prevented. Moreover, by forming the barrier film using titanium that is a highly reducible element, even if a thin oxide film is formed over the semiconductor films 603 and 604, the oxide film is reduced by the titanium contained in the barrier film, whereby preferable contact between the conductive film 621 and the semiconductor films 603 and between the conductive film 622 and the semiconductor film 604 can be obtained. Further, it is also possible to stack a plurality of barrier films. In that case, for example, each of the conductive films 621 and 622 can be formed to have a five-layer structure of titanium, titanium nitride, aluminum silicon, titanium, and titanium nitride in order from the bottom.

For the conductive films 621 and 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and 622.

Note that the conductive film 621 is connected to the high-concentration impurity region 611 of the n-channel transistor 617. The conductive film 622 is connected to the high-concentration impurity region 614 of the p-channel transistor 618.

FIG. 19 shows a cross-sectional view and a plan view of the n-channel transistor 617 and the p-channel transistor 618. However, in the plan view in FIG. 19, the conductive film 621, the conductive film 622, the insulating film 619, and the insulating film 620 are omitted for simplicity.

In addition, although the case where each of the n-channel transistor 617 and the p-channel transistor 618 includes one electrode 607 serving as the gate electrode is shown as an example in this embodiment mode, the present invention is not limited to this structure. The transistor manufactured in the present invention may have a multi-gate structure, in which a plurality of electrodes serving as gate electrodes are included and electrically connected to one another.

Moreover, the transistor included in the semiconductor device manufactured in the present invention may have a gate planar structure.

Note that the semiconductor film included in the SOI substrate according to the present invention is extremely near to a single crystal. Therefore, as compared to the case of using a polycrystalline semiconductor film, variation in crystal orientation is small; thus, variation in threshold voltage of transistors can be made small. Further, unlike a polycrystalline semiconductor film, crystal grain boundary is hardly observed; accordingly, leakage current due to a crystal grain boundary can be suppressed, and thus, power saving of a semiconductor device can be realized. Furthermore, variation of transistors due to variation of the size of crystal grains can be suppressed.

In a polycrystalline semiconductor film obtained by laser crystallization, a ridge is easily generated on a surface of the semiconductor film due to a distribution of energy density in a beam spot. However, a semiconductor film included in an SOI substrate is not needed to be irradiated with a laser beam, or may be irradiated with a laser beam with low energy density to the extent that defects in the semiconductor film due to bonding can be repaired. Accordingly, planarity of a surface of the semiconductor film included in an SOI substrate can be extremely high, and a gate insulating film formed over the semiconductor film can be thinned to approximately 5 nm to 50 nm. Thus, a high ON current can be obtained while a gate voltage is suppressed.

This embodiment mode can be used in combination with Embodiment Modes 1 to 4, as appropriate.

(Embodiment Mode 6)

Figure 20A:
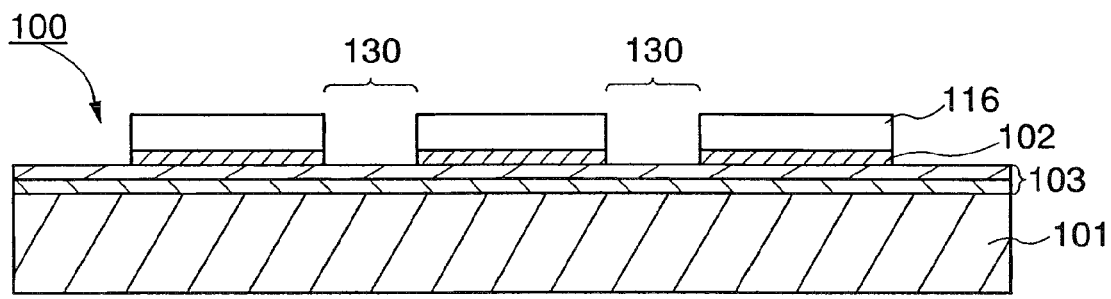
FIGS. 20A and 20B are cross-sectional views showing an example of a semiconductor device.
Figure 20B:
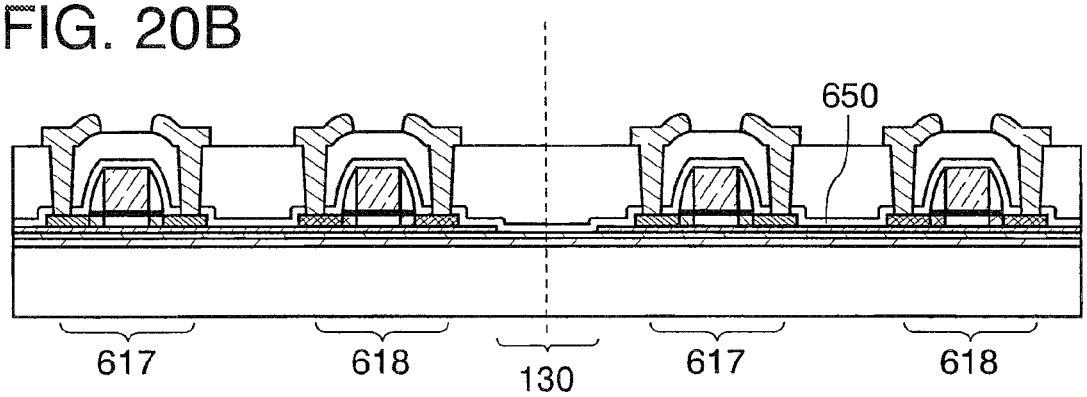

This embodiment mode describes, with reference to FIGS. 20A and 20B, an example of a semiconductor device using the semiconductor substrate 100 with the structure described in Embodiment Mode 3. Note that for the details of a manufacturing method or the like, Embodiment Mode 5 can be referred to.

FIG. 20A is a cross-sectional view showing a structural example of a semiconductor substrate 100. FIG. 20B is a cross-sectional view of a semiconductor device formed using the semiconductor substrate 100. The semiconductor substrate 100 of FIG. 20A has a structure in which a plurality of single crystal semiconductor layers 116 are bonded to one base substrate, which is the base substrate 101. Each of the single crystal semiconductor layers 116 is provided over the base substrate 101 with an insulating layer 102 and an insulating layer 103 interposed therebetween, and the semiconductor substrate 100 is referred to as a so-called SOI substrate. A semiconductor device of FIG. 20B includes a plurality of n-channel transistors 617 and p-channel transistors 618. Here, a region corresponding to a gap 130 (a gap between the single crystal semiconductor layers 116) in FIG. 20A is also present in FIG. 20B.

In the case of manufacturing a large-area semiconductor device, a plurality of single crystal semiconductor layers 116 are used. In this case, it is likely that the gap 130 of at least greater than or equal to several micrometers is present, though it also depends on accuracy of bonding of the single crystal semiconductor layer 116, or the like. In the case where such a gap 130 is present, there is a possibility that penetration of an impurity element from the region becomes a problem.

Thus, in this embodiment mode, a semiconductor device is formed using the semiconductor substrate 100 having the structure described in Embodiment Mode 3. In the semiconductor substrate 100 having the structure described in Embodiment Mode 3, an insulating layer serving as a barrier layer is provided over an entire surface of the base substrate 101; accordingly, penetration of an impurity element from the region corresponding to the gap 130 can be precluded. Further, in this embodiment mode, an insulating layer 650 serving as a barrier layer is provided so as to cover the plurality of n-channel transistors 617 and p-channel transistors 618 which are semiconductor elements. Thus, penetration of an impurity element from above the semiconductor elements can be precluded.

That is, with the use of the structure described in this embodiment mode, penetration of an impurity from the base substrate 101 and penetration of an impurity element from above a semiconductor element in a process for manufacturing a semiconductor element or the like, can be precluded. Accordingly, deterioration of characteristics of a semiconductor element due to penetration of an impurity element can be prevented, and thus, a highly reliable semiconductor device can be provided.

Note that the only difference between the structures of the semiconductor devices described in this embodiment mode and Embodiment Mode 5 is that the substrate relating to Embodiment Mode 3 is used as an SOI substrate in this embodiment mode. Therefore, for the details of other parts, Embodiment Mode 5 can be referred to.

This embodiment mode can be used in combination with Embodiment Modes 1 to 5, as appropriate.
(Embodiment Mode 7)

This embodiment mode describes a specific mode of a semiconductor device using an SOI substrate with reference to drawings.

Figure 21:
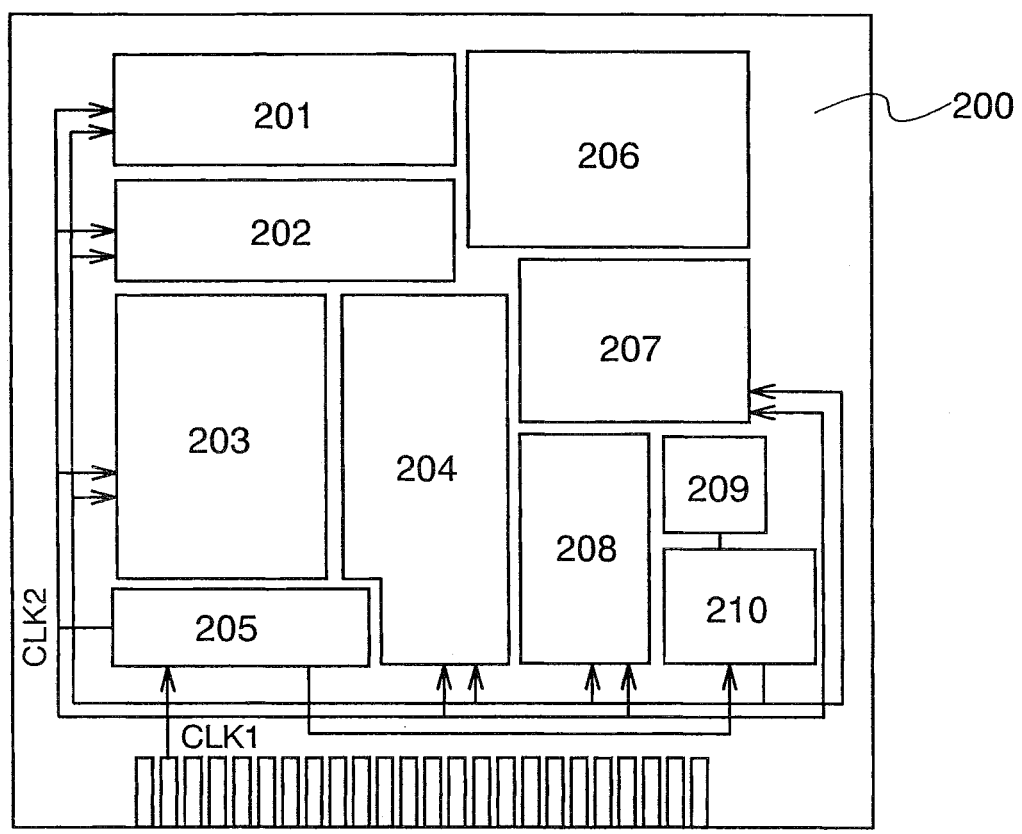
FIG. 21 is a block diagram showing a configuration of a microprocessor that is obtained using an SOI substrate.

First, as an example of the semiconductor device, a microprocessor will be described. FIG. 21 is a block diagram showing a structural example of a microprocessor 200.

This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction.

In specific, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207.

For example, the timing controller 205 is provided with an internal clock generator for generating an internal clock signal CLK2 based on a reference clock signal CLK1, and supplies the internal clock signal CLK2 to the various abovementioned circuits. Note that the microprocessor 200 shown in FIG. 21 is merely an example in which the configuration is simplified, and an actual microprocessor may have a wide variety of configurations depending on the uses.

The microprocessor 200 can achieve not only an increase in processing speed but also a reduction in power consumption because an integrated circuit is formed using a single crystal semiconductor layer (an SOI layer) with uniform crystal orientation which is bonded over a substrate having an insulating surface or an insulating substrate.

Figure 22:
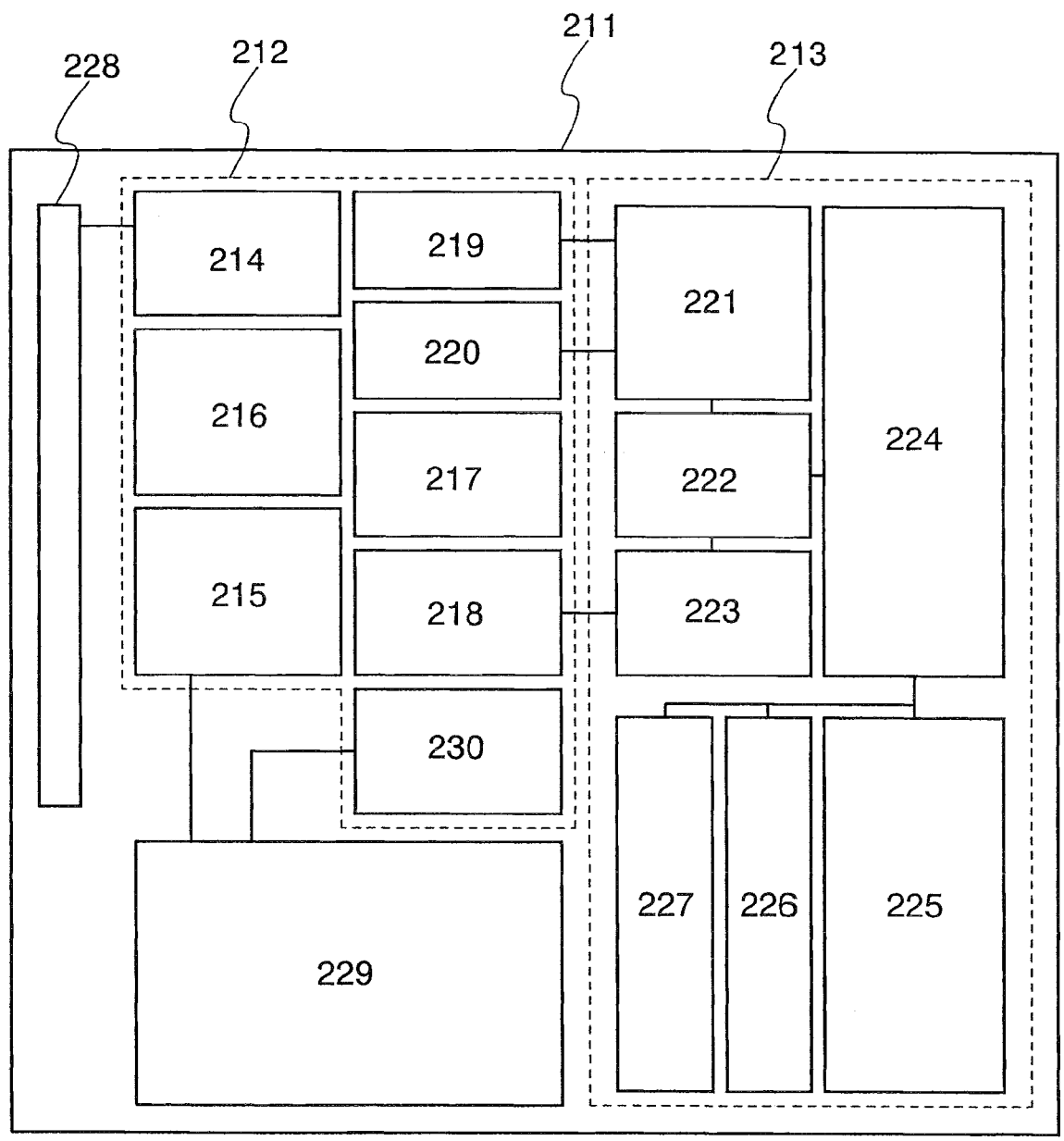
FIG. 22 is a block diagram showing a configuration of an RFCPU that is obtained using an SOI substrate.

Next, an example of a semiconductor device provided with a function of transmitting and receiving data without contact and an arithmetic function is described. FIG. 22 is a block diagram showing a structural example of such a semiconductor device. The semiconductor device shown in FIG. 22 can be called a computer which operates to transmit and receive signals to and from an external device through wireless communication (hereinafter the computer is referred to as an RFCPU).

As shown in FIG. 22, an RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power supply control circuit 230. The digital circuit portion 213 has an RF interface 221, a control register 222, a clock controller 223, a CPU interface 224, a central processing unit 225, a random-access memory 226, and a read-only memory 227.

The operation of the RFCPU 211 having such a configuration is roughly described below. An induced electromotive force is generated by the resonance circuit 214 based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and the capacitor portion 229 can be mounted as a different component on a substrate having an insulating surface which is included in the RFCPU 211.

The reset circuit 217 generates a signal for resetting and initializing the digital circuit portion 213. For example, a signal that rises after an increase in power supply voltage is generated as the reset signal. The oscillator circuit 218 changes the frequency and duty ratio of a clock signal in response to a control signal generated by the constant voltage circuit 216. The demodulator circuit 219 is a circuit which demodulates a received signal, and the modulator circuit 220 is a circuit which modulates data that is to be transmitted.

The demodulation circuit 219 having a low pass filter, for example, binarizes received signals of an amplitude shift keying (ASK) system based on changes in amplitude of the signals. The modulation circuit 220 transmits transmission data by changing the amplitude of a transmission signal of an amplitude shift keying (ASK) system. The modulation circuit 220 changes the resonance point of the resonance circuit 214, thereby changing the amplitude of a communication signal.

The clock controller 223 generates a control signal for changing the frequency and duty ratio of a clock signal in accordance with the power supply voltage or a consumption current of the central processing unit 225. The power supply voltage is monitored by the power supply control circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like.

The central processing unit 225 accesses the read-only memory 227, the random-access memory 226, and the control register 222 via the CPU interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the an operating system (OS) is stored in the read-only memory 227 and a program is read and executed at the time of starting operation. Alternatively, a method may be employed in which a circuit dedicated to arithmetic is formed as an arithmetic circuit and an arithmetic processing is conducted using hardware. In a method in which both hardware and software are used, part of processing can be conducted by a circuit dedicated to arithmetic, and the other part of the arithmetic processing can be conducted by the central processing unit 225 using a program.

The RFCPU 211 described above can achieve not only an increase in processing speed but also a reduction in power consumption because an integrated circuit is formed using a semiconductor layer with uniform crystal orientation which is bonded over a substrate having an insulating surface or an insulating substrate. Accordingly, even when the capacitor portion 229 which supplies electric power is miniaturized, long-term operation is ensured.

Next, a display device of the present invention is described with reference to FIG. 23, FIGS. 24A and 24B, and FIGS. 25A and 25B. Note that a display device is a kind of a semiconductor device.

Figure 23:
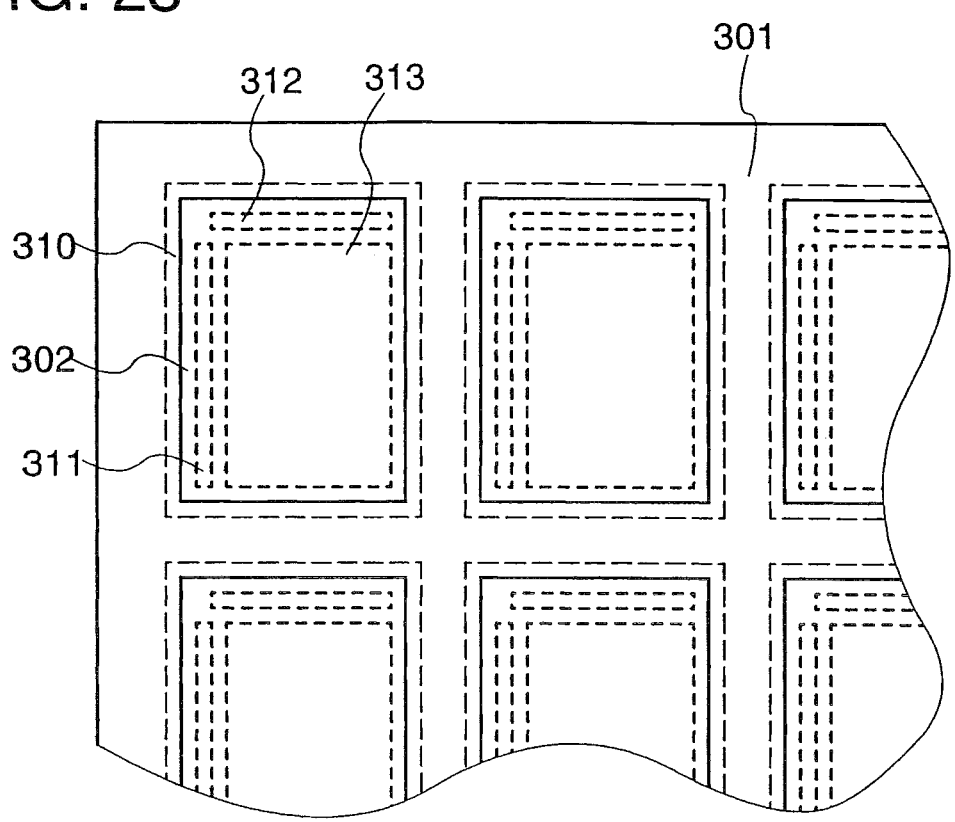
FIG. 23 is a plan view of an SOI substrate which uses a mother glass as a base substrate.

A large-area glass substrate called mother glass for manufacturing a display panel can be used as a base substrate of an SOI substrate. FIG. 23 is a front view of an SOI substrate in which mother glass is used as the base substrate 101.

A plurality of semiconductor layers 302 which are separated from a plurality of semiconductor substrates are bonded to mother glass 301. In order to divide the mother glass 301 to produce a plurality of display panels, the semiconductor layers 302 are preferably bonded in formation regions 310 of the display panels. It is necessary that the semiconductor layers 302 be bonded in at least scanning line driver circuit formation regions 311, signal line driver circuit formation regions 312, pixel formation regions 313, and the like in the formation regions 310 of display panels. Note that although FIG. 23 shows a structure using one semiconductor layer for each display panel, a plurality of semiconductor layers are used for one display panel in the case of manufacturing a middle-sized or large-sized display device.

Figure 24A:
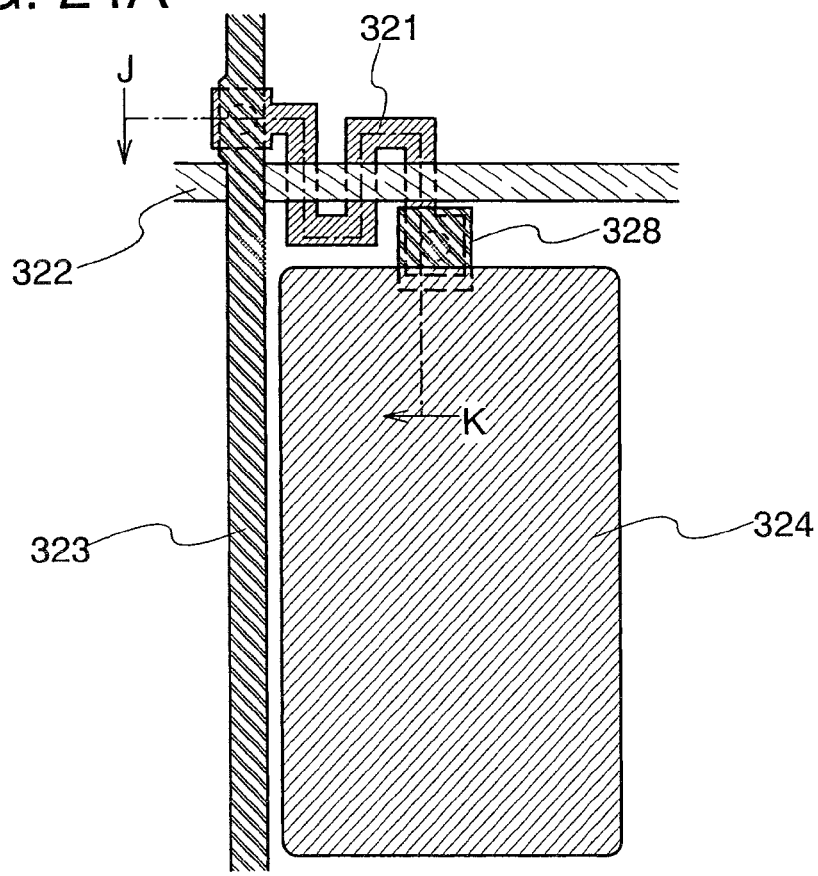
FIGS. 24A and 24B are a plan view of a pixel of a liquid crystal display device and a cross-sectional view along cutting line J-K, respectively.
Figure 24B:
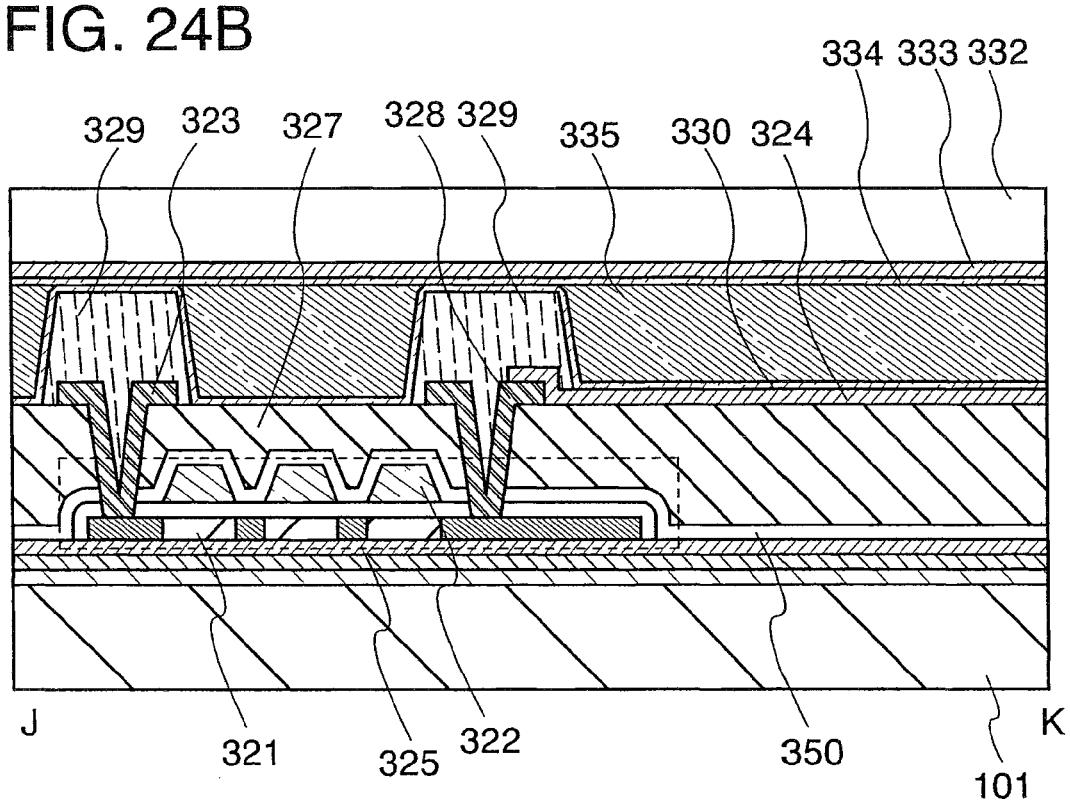

FIGS. 24A and 24B are drawings for showing a liquid crystal display device manufactured using the SOI substrate shown in FIG. 23. FIG. 24A is a plan view of a pixel of the liquid crystal display device and FIG. 24B is a cross-sectional view along a cutting line J-K of FIG. 24A.

In FIG. 24A, a semiconductor layer 321 is a layer formed of the semiconductor layer 302 which is bonded to the SOI substrate and included in a TFT of the pixel. Here, the SOI substrate manufactured by the method of Embodiment Mode 3 is used as the SOI substrate. As shown in FIG. 24B, a substrate, in which insulating layers (two layers), a bonding layer, and a semiconductor layer are stacked over a base substrate 101, is used. The base substrate 101 is the mother glass 301 which has been divided. As shown in FIG. 24A, the pixel includes the semiconductor layer 321, a scanning line 322 which intersects with the semiconductor layer 321, a signal line 323 which intersects with the scanning line 322, a pixel electrode 324, and an electrode 328 which electrically connects the pixel electrode 324 and the semiconductor layer 321 to each other.

As shown in FIG. 24B, a TFT 325 of the pixel is formed over the bonding layer. A gate electrode of the TFT 325 is included in the scanning line 322, and a source electrode or a drain electrode of the TFT 325 is included in the signal line 323. The signal line 323, the pixel electrode 324, and the electrode 328 are provided over the interlayer insulating film 327. Further, column spacers 329 are formed over the interlayer insulating film 327, and an orientation film 330 is formed covering the signal line 323, the pixel electrode 324, the electrode 328, and the column spacers 329. A counter substrate 332 is provided with a counter electrode 333 and an orientation film 334 which covers the counter electrode 333. The columnar spacers 329 are formed to keep a gap between the base substrate 101 and the counter substrate 332. A liquid crystal layer 335 is formed in space formed by the columnar spacers 329. At portions where the semiconductor layer 321 is connected to the signal line 323 and the electrode 328, steps are generated in the interlayer insulating film 327 by formation of the contact holes. The steps disorder orientation of liquid crystal of the liquid crystal layer 335. Therefore, the column spacers 329 are formed at these step portions to prevent the disorder of the orientation of liquid crystal. Note that in the liquid crystal display device shown in FIGS. 24A and 24B, the TFT 325 of the pixel is covered with an insulating layer 350 serving as a barrier layer, and functions to prevent penetration of an impurity element from outside in cooperation with the insulating layers (two layers) over the base substrate 101.

Figure 25A:
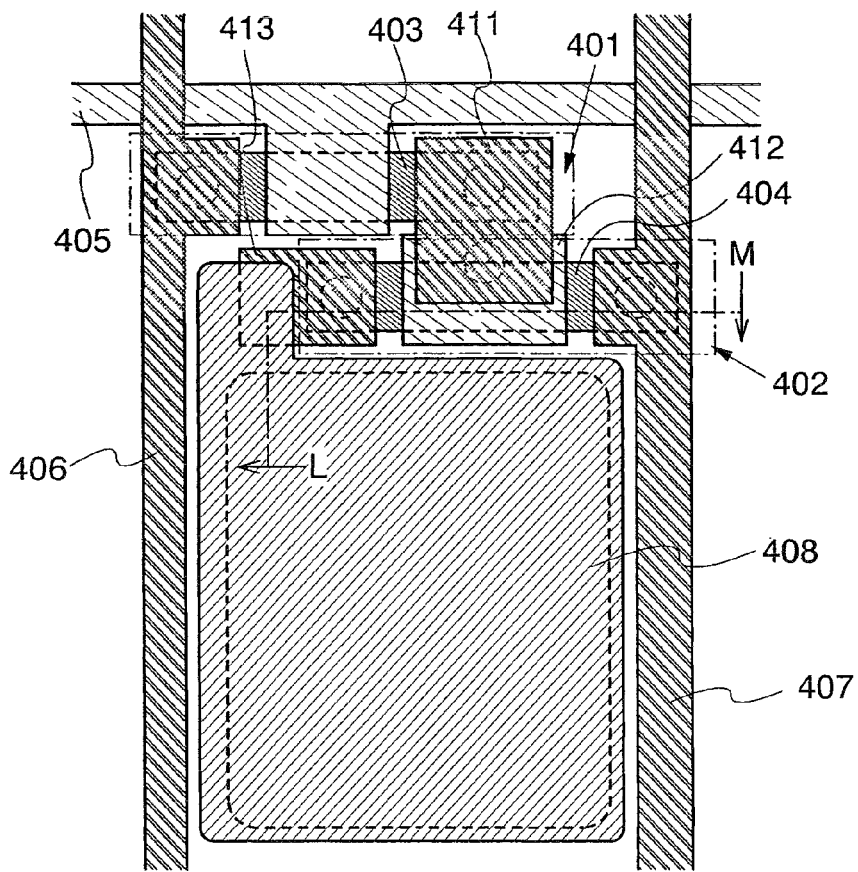
FIGS. 25A and 25B are a plan view of a pixel of an electroluminescent display device and a cross-sectional view along cutting line L-M, respectively.
Figure 25B:
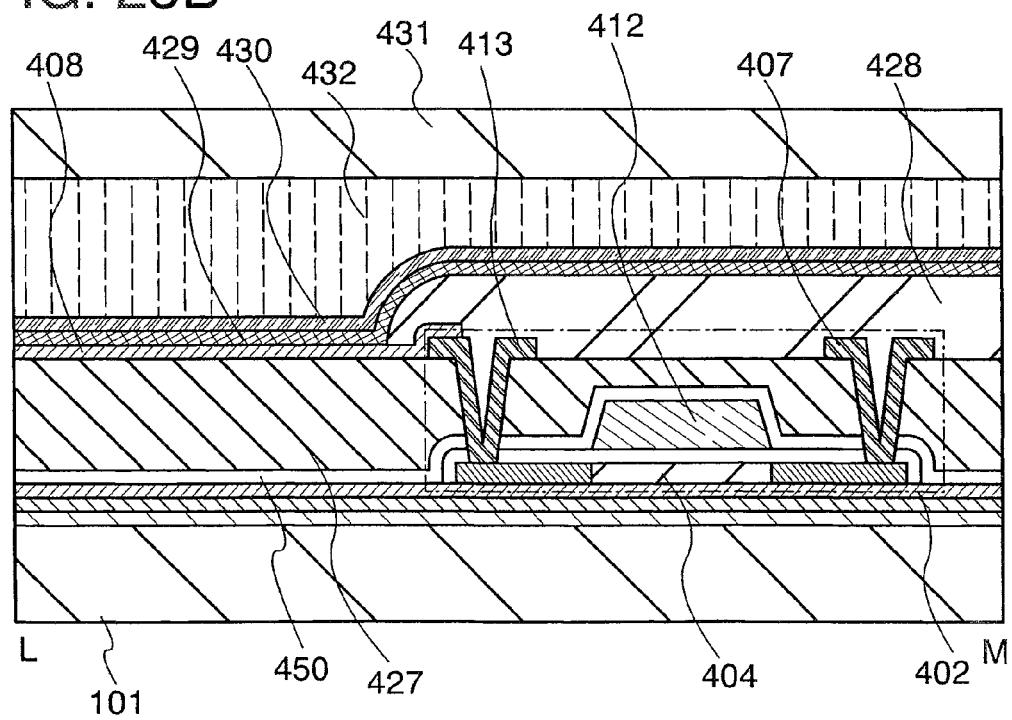

Next, an electroluminescent display device (hereinafter referred to as an EL display device) will be described. FIGS. 25A and 25B are drawings showing an EL display device manufactured using the SOI substrate shown in FIG. 23. FIG. 25A is a plan view of a pixel of the EL display device, and FIG. 25B is a cross-sectional view of the pixel. Note that FIG. 25B corresponds to a cutting line L-M of FIG. 25A.

As shown in FIG. 25A, in the pixel, a selection transistor 401 and a display control transistor 402 are formed with TFTs. The semiconductor layer 403 of the selection transistor 401 and the semiconductor layer 404 of the display control transistor 402 are layers formed by processing the semiconductor layer 302 of the SOI substrate of FIG. 23. The pixel includes a scanning line 405, a signal line 406, a current supply line 407, and a pixel electrode 408. In the EL display device, each pixel is provided with a light-emitting element having a structure in which a layer including an electroluminescent material (this layer is also referred to as an EL layer) is sandwiched between a pair of electrodes. One electrode of the light emitting element is the pixel electrode 408.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

As the SOI substrate, the SOI substrate manufactured by the method of Embodiment Mode 3 is used. As in FIG. 24B, insulating layers (two layers), a bonding layer, and a semiconductor layer are stacked over a base substrate 101. The base substrate 101 is the mother glass 301 which has been divided.

As shown in FIG. 25B, an interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate, and is fixed to the base substrate 101 by a resin layer 432. The pixel shown in FIGS. 25A and 25B is arranged in a matrix in the pixel portion of the EL display device. Note that in the electroluminescent display device shown in FIGS. 25A and 25B, the selection transistor 401 and the display control transistor 402 are covered with an insulating layer 450 serving as a barrier layer, and function to prevent penetration of an impurity element from outside in cooperation with the insulating layers (two layers) over the base substrate 101.

The grayscale of the EL display device is controlled by either a current drive method by which the luminance of the light-emitting element is controlled by the amount of current or a voltage drive method by which control is performed basically by the amount of voltage. The current drive method is difficult to adapt when transistors have characteristics which are largely different for each pixel, and therefore a compensation circuit for compensating variation in characteristics is necessary. By using the SOI substrate of the present invention, characteristic variation of the selection transistor 401 and the display control transistor 402 between pixels is negligible; therefore, the current driving method can be employed.

As shown in FIGS. 24A and 24B and FIGS. 25A and 25B, an SOI substrate can be manufactured using mother glass for manufacturing a display device, and a display device can be manufactured using the SOI substrate. Moreover, since even the microprocessor as described with reference to FIG. 21 and FIG. 22 can be formed using this SOI substrate, the display device can also have a function of computer. Furthermore, a display device capable of input and output of data without contact can also be manufactured.

That is, by using the SOI substrate of the present invention, various electric appliances can be manufactured. The electric appliances include video cameras, digital cameras, navigation systems, audio reproducing devices (such as car audios or audio components), computers, game machines, portable information terminals (such as mobile computers, cellular phones, portable game machines, or electronic books), image reproducing devices provided with a recording medium (specifically, devices that can reproduce image data recorded in a recording medium such as a digital versatile disk (DVD) and are equipped with a display device capable of displaying the image), and the like.

Figure 26A:
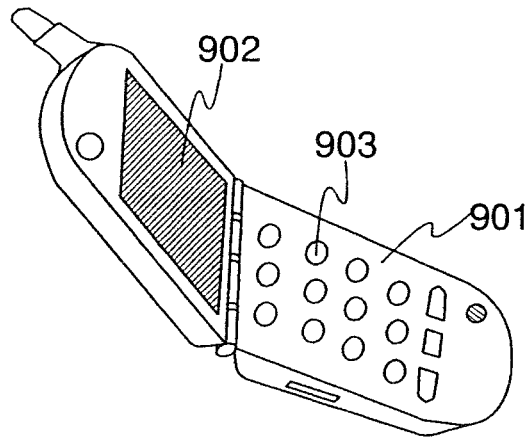
FIGS. 26A to 26C are an external view of a cellular phone, an external view of a digital player, and an external view of an electronic book reader, respectively.
Figure 26B:
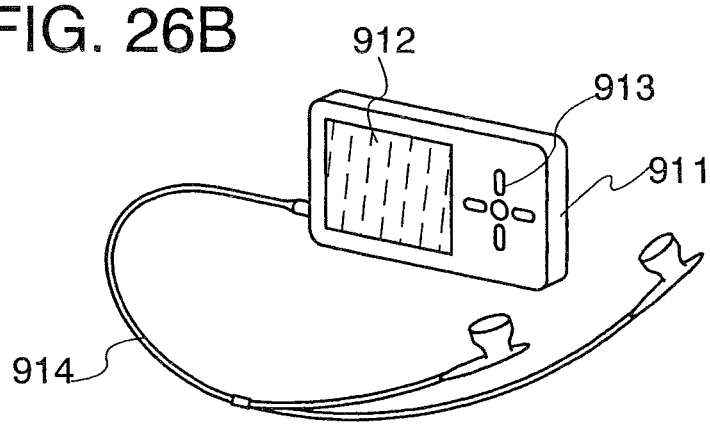
Figure 26C:
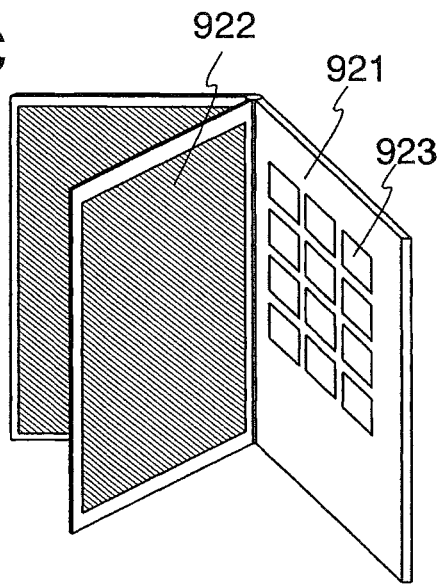

With reference to FIG. 26A to 26C, specific modes of the electric appliances are described. FIG. 26A is an external view showing an example of a cellular phone 901. This cellular phone 901 includes a display portion 902, operation switches 903, and the like. By applying the liquid crystal display device shown in FIGS. 24A and 24B or the EL display device shown in FIGS. 25A and 25B to the display portion 902, the display portion 902 can have little display unevenness and excellent image quality. A semiconductor device formed using an SOI substrate of the present invention can also be applied to a microprocessor, a memory, or the like included in the cellular phone 901.

FIG. 26B is an external view of a digital player 911. The digital player 911 includes a display portion 912, an operation portion 913, an earphone 914, and the like. Instead of the earphone 914, a headphone or a wireless earphone can be used. By applying the liquid crystal display device shown in FIGS. 24A and 24B or the EL display device shown in FIGS. 25A and 25B to the display portion 912, a high-resolution image and much character information can be displayed even in the case where the size of an image area is approximately 0.3 inches to 2 inches. A semiconductor device formed using an SOI substrate of the present invention can be applied to a memory portion which stores music information and a microprocessor which are included in the digital player 911.

FIG. 26C is an external view of an electronic book reader 921. This electronic book reader 921 includes a display portion 922 and an operation switch 923. The electronic book reader 921 may incorporate a modem or may incorporate the RFCPU shown in FIG. 22 so that information can be transmitted and received wirelessly. By employing the liquid crystal display device shown in FIGS. 24A and 24B or the EL display device shown in FIGS. 25A and 25B for the display portion 922, an image with high image quality can be displayed. In the electronic book reader 921, a semiconductor device formed using an SOI substrate of the present invention can be applied to a memory portion which stores information or a microprocessor which allows the electronic book reader 921 to operate.

This embodiment mode can be combined with Embodiment Modes 1 to 6 as appropriate.

This application is based on Japanese Patent Application serial no. 2007-245822 filed with Japan Patent Office on Sep. 21, 2007, the entire contents of which are hereby incorporated by reference.

What is claimed is:

1. A semiconductor device comprising:
   a substrate including an impurity element;
   a plurality of bonding layers over the substrate;
   a plurality of first barrier layers over the plurality of bonding layers;
   a plurality of films including halogen over the plurality of first barrier layers;
   a plurality of semiconductor elements over the plurality of films including halogen, each of the plurality of semiconductor elements comprising a single crystal semiconductor layer; and
   a second barrier layer covering the plurality of semiconductor elements, wherein the plurality of bonding layers do not overlap with each other.

2. The semiconductor device according to claim 1, wherein the plurality of first barrier layers serve as a plurality of barrier layers against the impurity element.

3. The semiconductor device according to claim 1, wherein the impurity element affects a characteristic of each of the plurality of semiconductor elements.

4. The semiconductor device according to claim 1, wherein each of the plurality of first barrier layers has a stacked-layer structure of a silicon oxynitride film and a silicon nitride oxide film.

5. The semiconductor device according to claim 1, wherein the second barrier layer has a stacked-layer structure of a silicon oxynitride film and a silicon nitride oxide film.

6. An electric appliance using the semiconductor device according to claim 1, wherein the electric appliance is one selected from the group consisting of a video camera, a digital camera, a navigation system, an audio reproducing device, a computer, a game machine, a portable information terminal, and an image reproducing device provided with a recording medium.

7. The semiconductor device according to claim 1, wherein each of the plurality of bonding layers is bonded to the substrate.

8. A semiconductor device comprising:
a substrate including an impurity element;
a first barrier layer over the substrate;
a plurality of bonding layers over the first barrier layer;
a plurality of films including halogen over the plurality of bonding layers;
a plurality of semiconductor elements over the plurality of films including halogen, each of the plurality of semiconductor elements comprising a single crystal semiconductor layer; and
a second barrier layer covering the plurality of semiconductor elements,
wherein the plurality of bonding layers do not overlap with each other.

9. The semiconductor device according to claim 8, wherein the first barrier layer is provided in a region corresponding to a gap between the single crystal semiconductor layer of one of the plurality of semiconductor elements and the single crystal semiconductor layer of another one of the plurality of semiconductor elements which is adjacent to the one of the plurality of semiconductor elements.

10. The semiconductor device according to claim 9, wherein the gap is less than or equal to 0.5 mm.

11. The semiconductor device according to claim 8, wherein a plurality of third barrier layers are provided between the plurality of bonding layers and the plurality of semiconductor elements.

12. The semiconductor device according to claim 8, wherein the first barrier layer serves as a barrier layer against the impurity element.

13. The semiconductor device according to claim 8, wherein the impurity element affects a characteristic of each of the plurality of semiconductor elements.

14. The semiconductor device according to claim 8, wherein the first barrier layer has a stacked-layer structure of a silicon oxynitride film and a silicon nitride oxide film.

15. The semiconductor device according to claim 8, wherein the second barrier layer has a stacked-layer structure of a silicon oxynitride film and a silicon nitride oxide film.

16. An electric appliance using the semiconductor device according to claim 8, wherein the electric appliance is one selected from the group consisting of a video camera, a digital camera, a navigation system, an audio reproducing device, a computer, a game machine, a portable information terminal, and an image reproducing device provided with a recording medium.

17. The semiconductor device according to claim 8, wherein each of the plurality of bonding layers is bonded to the first barrier layer.

* * * * *